(12) United States Patent
Lee

(10) Patent No.: US 7,397,721 B2
(45) Date of Patent: Jul. 8, 2008

(54) STANDBY LEAKAGE CURRENT REDUCTION CIRCUIT AND SEMICONDUCTOR MEMORY DEVICE COMPRISING THE STANDBY LEAKAGE CURRENT REDUCTION CIRCUIT

(75) Inventor: Young-Dae Lee, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 11/583,066

(22) Filed: Oct. 19, 2006

(65) Prior Publication Data

US 2007/0147159 A1    Jun. 28, 2007

(30) Foreign Application Priority Data

Dec. 28, 2005    (KR) ............... 10-2005-0131194

(51) Int. Cl.
*G11C 5/14* (2006.01)
(52) U.S. Cl. .................. 365/227; 365/226; 365/229
(58) Field of Classification Search ............ 365/227, 365/226, 230.06, 154; 327/543–546
See application file for complete search history.

(56) References Cited

U.S. PATENT DOCUMENTS

| | | | |
|---|---|---|---|
| 6,525,983 B2 | 2/2003 | Wilkins | |
| 6,611,451 B1 | 8/2003 | Houston | |
| 6,836,179 B2 * | 12/2004 | Mizuno et al. | 327/544 |
| 6,977,519 B2 * | 12/2005 | Bhavnagarwala et al. | 326/34 |
| 7,145,383 B2 * | 12/2006 | Mizuno et al. | 327/546 |
| 7,164,616 B2 * | 1/2007 | Miller et al. | 365/230.06 |
| 7,271,615 B2 * | 9/2007 | Afghahi et al. | 326/33 |
| 2007/0040575 A1 * | 2/2007 | Afghahi et al. | 326/34 |

* cited by examiner

*Primary Examiner*—Gene N. Auduong
(74) *Attorney, Agent, or Firm*—Volentine & Whitt, PLLC

(57) ABSTRACT

Embodiments of the invention provide a standby leakage current reduction circuit and a semiconductor memory device comprising the standby leakage current reduction circuit. The invention provides a circuit adapted to reduce standby leakage current in a semiconductor memory device comprising memory cells. The circuit comprises a bias signal generator adapted to generate a bias signal, wherein a voltage level of the bias signal is set in accordance with a result of a standby leakage current test. The circuit further comprises a ground voltage controller adapted to receive the bias signal from the bias signal generator and to control a level of a voltage apparent on a virtual ground terminal in response to the bias signal while the semiconductor memory device is in a standby mode.

28 Claims, 18 Drawing Sheets

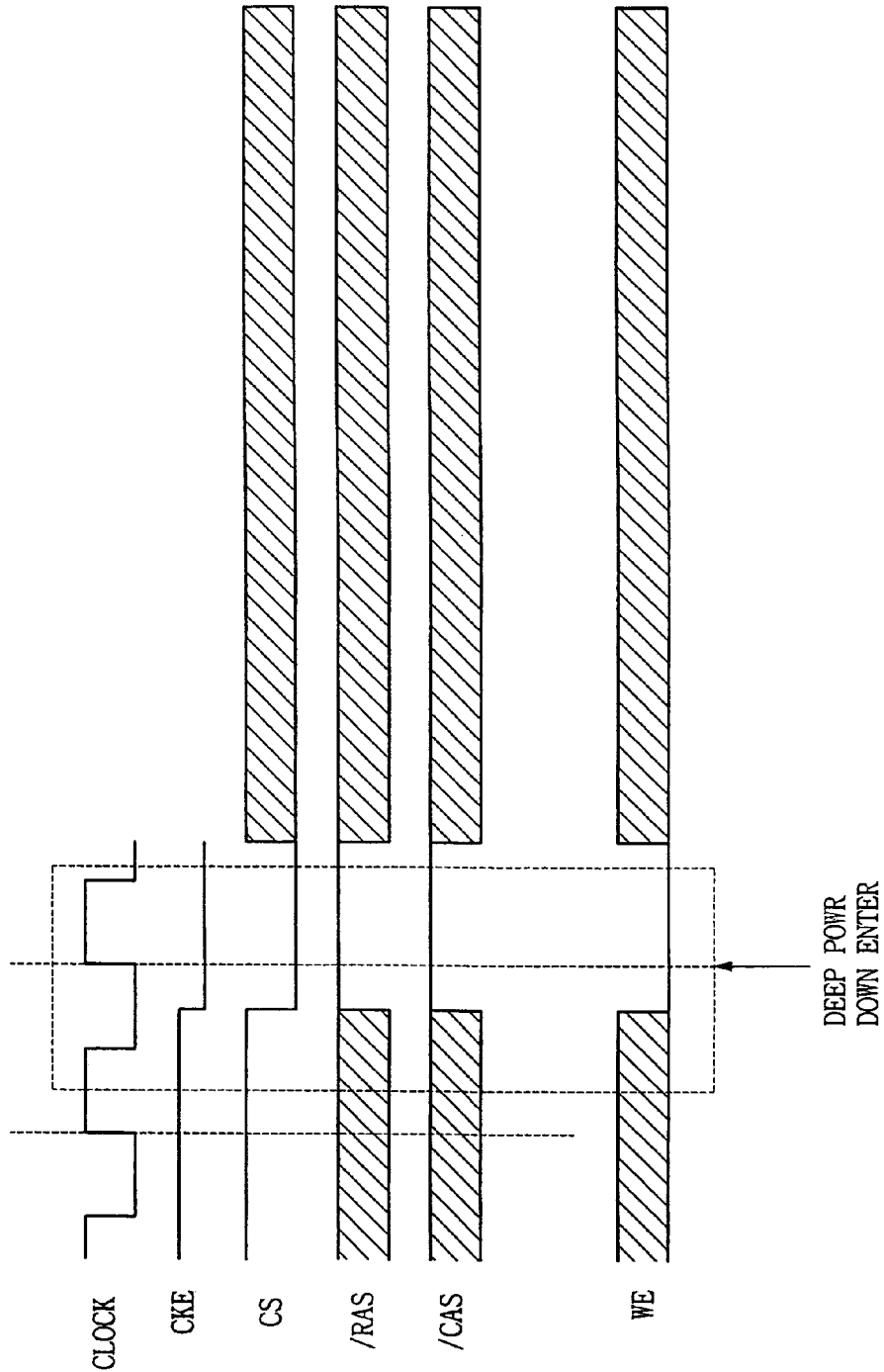

DEEP POWR DOWN EXIT

STANDBY LEAKAGE CURRENT REDUCTION CIRCUIT AND SEMICONDUCTOR MEMORY DEVICE COMPRISING THE STANDBY LEAKAGE CURRENT REDUCTION CIRCUIT

BACKGROUND

1. Field of the Invention

Embodiments of the invention relate to a semiconductor memory device. In particular, embodiments of the invention relate to a standby leakage current reduction circuit and a semiconductor memory device comprising the standby leakage current reduction circuit.

This application claims priority to Korean Patent Application 10-2005-0131194, filed on Dec. 28, 2005, the subject matter of which is hereby incorporated by reference in its entirety.

2. Description of Related Art

Generally, standby current in a semiconductor memory device may be current that leaks from a semiconductor memory device while the semiconductor memory device is in a standby mode. Standby current may also be referred to herein as standby leakage current.

An active mode of a semiconductor memory device may be a mode in which peripheral circuits of the semiconductor memory device operate to store data in memory cells of the semiconductor memory device or output data stored in the memory cells to an element(s) outside of the semiconductor memory device. A standby mode of a semiconductor memory device may be a mode in which read and write operations are not performed on the memory cells. In addition, peripheral circuits may be disabled and the amount of power consumed by the peripheral circuits may be reduced while the semiconductor memory device is in the standby mode.

When a semiconductor memory device is in a standby mode for a relatively long amount of time, the semiconductor memory device enters a deep power down mode in order to stop the operation of peripheral circuits to thereby reduce the amount of power consumed by the semiconductor memory device in the standby mode.

FIG. 1A is a timing diagram illustrating timings for an exemplary entry of a conventional semiconductor memory device into a deep power down mode, and FIG. 1B is a timing diagram illustrating timings for an exemplary exit of a conventional semiconductor memory device from the deep power down mode. The deep power down mode will now be described briefly.

The deep power down mode is controlled by an external command. In the semiconductor memory device, after a precharge time tRT elapses (precharge time tRT is initiated in accordance with a precharge command), the semiconductor memory device enters a deep power down mode DPD and then exits deep power down mode DPD in response to a clock signal CLOCK and in accordance with the respective states of signals input through an external signal pin of the semiconductor memory device. The signals may be a chip selection signal CS, a row address strobe /RAS, a column address strobe /CAS, a write enable signal WE, and a clock enable signal CKE.

An exemplary process in which a semiconductor memory device enters and exits deep power down mode DPD will now be described. When chip selection signal CS, clock enable signal CKE, and write enable signal WE each have a logic low level; and row address strobe /RAS and column address strobe /CAS each have a logic high level, the semiconductor memory device enters deep power down mode DPD in response to clock signal CLOCK. Then, regardless of the respective logic levels of chip selection signal CS, row address strobe /RAS, column address strobe /CAS, and write enable signal WE, deep power down mode DPD is completed (i.e., the semiconductor memory device exits deep power down mode DPD) when clock enable signal CKE transitions to a logic high level (see FIG. 1B).

Standby leakage current will now be described using a Static Random Access Memory (SRAM) device as an exemplary semiconductor memory device in which standby leakage occurs.

A unit-memory cell of SRAM is generally configured to store data using a latch comprising two inverters connected with one another. Data may be stored in a memory cell using a bit line pair and may also be output from the memory cell. In addition, bit line pairs are precharged with a voltage having a given level before data is input or output.

FIG. 2 is a circuit diagram illustrating standby leakage current in a portion of a conventional SRAM device. FIG. 2 illustrates a unit-memory cell of an SRAM device, and standby leakage current in the unit-memory cell is represented by arrows.

Standby leakage current in the SRAM device may be divided into gate leakage current (represented by gate leakage current arrows A1) and sub-threshold leakage current (represented by sub-threshold leakage current arrows A2). Referring to transistors PM11, PM12, NM11, NM12, NM13, and NM14 of FIG. 2, a gate leakage current arrow A1 may indicate standby leakage current passing between a drain terminal and a gate terminal, or between a source terminal and a gate terminal, of one of the transistors mentioned previously. A sub-threshold leakage current arrow A2 may indicate standby leakage current flowing between one or more pairs of drain and source terminals.

When the semiconductor memory device partially illustrated in FIG. 2 is in the standby mode, the voltage level apparent on word line WL within the semiconductor memory device has a logic low level, so access transistors NM13 and NM14 are turned OFF. Thus, first and second output terminals N1 and N2 of the first and second inverters illustrated in FIG. 2, which may be storing data, are electrically insulated from bit line pair BL, BLB. The first inverter of FIG. 2 comprises PMOS transistor PM11 and NMOS transistor NM11, and the second inverter of FIG. 2 comprises PMOS transistor PM12 and NMOS transistor NM12.

Then, bit line pair BL, BLB is precharged to a power source voltage VCC by a bit line precharge circuit (not shown). When bit line pair BL, BLB is precharged to a power source voltage VCC, standby leakage current (which is indicated by arrows A1 and A2) flows. The magnitude of the standby leakage current indicated by arrows A1 and A2 is proportional to the magnitude of power source voltage VCC.

In general, power source voltages VCC having various voltage levels are applied to a semiconductor memory device according to strictly defined specifications so as to properly control the device's operating characteristics. The magnitude of standby leakage current (comprising gate leakage current and sub-threshold leakage current) is proportional to the magnitude of power source voltage VCC. When a high level power source voltage HVCC (i.e., a power source voltage VCC having a relatively high voltage level) is applied in the semiconductor memory device, the amount of standby leakage current may increase. Many attempts to reduce the amount of standby leakage current suffered by memory cells based on varying the voltage level of power source voltage VCC have been proposed, as in, for example, U.S. Pat. Nos.

6,970,374; 6,611,451; and 5,764,566. The subject matter of each of the preceding patents is hereby incorporated by reference in its entirety.

Two of the various methods used to reduce standby leakage current will be described herein. The first method is an exemplary method for increasing the threshold voltage Vth of MOS (Metal Oxide Semiconductor) transistors within a memory cell, and the second is a method for differentially controlling the levels of the voltages apparent on respective ground connection terminals Vgnd of memory cells during an active mode and a standby mode, etc. Each ground connection terminal Vgnd may be referred to herein as a virtual ground terminal Vgnd in order to clearly distinguish it from ground voltage VSS.

One shortcoming of this method of increasing the threshold voltage Vth of a MOS transistor in a memory cell is that certain operating characteristics of the memory cell may become impaired when a relatively low external power source voltage LVCC is applied in the semiconductor memory device.

In the method for differentially controlling the level of the voltage apparent on a virtual ground terminal Vgnd of memory cells in an active mode and in a standby mode, virtual ground terminal Vgnd may be set to a voltage level substantially equal to a ground voltage VSS when the semiconductor memory device is in the active mode, and a voltage apparent on virtual ground terminal Vgnd may be set to a voltage level greater than ground voltage VSS when the semiconductor memory device is in the standby mode. Thus, the method may reduce standby leakage current by reducing a power source voltage VCC and reducing a margin between the level of the power source voltage VCC and the level of the voltage apparent on virtual ground terminal Vgnd.

FIG. 3 is a circuit diagram illustrating a portion of an exemplary conventional SRAM device.

Referring to FIG. 3, the SRAM device of FIG. 3 may comprise a memory cell sector 30, a bias sector 32, and a sleep sector 34. Memory cell sector 30 may comprise memory cells adapted to store data. In addition, bias sector 32 controls the voltage level of virtual ground terminal Vgnd when the SRAM device of FIG. 3 is in the standby mode. Bias sector 32 comprises NMOS transistors NM31 to NM34. NMOS transistors NM31 to NM34 receive bias signals bias0 to bias3, respectively, and control an operational resistance apparent in bias sector 32. The operational resistance is calculated in accordance with the level of the voltage apparent on virtual ground terminal Vgnd and the amount of current flowing between drain and source terminals of NMOS transistors NM31 to NM34. The voltage apparent on virtual ground terminal Vgnd is represented herein as the product of a current Ioff, which is the current flowing between source and drain terminals of NMOS transistors NM31 to NM34 when the SRAM device is in a standby mode, and the operational resistance of NMOS transistors NM31 to NM34.

That is, the voltage apparent on virtual ground terminal Vgnd may be expressed as Vgnd=Ioff*Rbias_on, wherein Rbias_on represents the operational resistance of NMOS transistors NM31 to NM34.

Sleep sector 34 is controlled in accordance with a sleep signal Sleep, and comprises a sleep transistor NM35 that is turned ON when the memory cell sector is in an active mode and is turned OFF when the memory cell sector is in a standby mode.

As described above, the SRAM device partially illustrated in FIG. 3 may reduce standby leakage current by controlling the voltage level apparent on virtual ground voltage Vgnd through bias sector 32.

In addition, various mobile applications require very low standby leakage current. In these applications, the amount of standby leakage current is very sensitive to variations in the fabrication processes used to manufacture the constituent semiconductor device, variations in the applied external power source voltage (i.e., the level of a voltage received form an external power source), and temperature.

However, a limitation in conventional semiconductor memory devices is that conventional semiconductor memory devices do not account for process variation or temperature variation when reducing standby leakage current.

Conventional semiconductor memory devices suffer from problems such as data loss and the consumption of excess power as a result of standby leakage current caused by variations in temperature, external power source voltage, and fabrication process (hereafter "process scatter").

SUMMARY OF THE INVENTION

Accordingly, embodiments of the invention provide a standby leakage current reduction circuit and a semiconductor memory device comprising the standby leakage current reduction circuit, wherein the standby leakage current reduction circuit is adapted to reduce standby leakage current that may be caused by process scatter, (e.g., variations in process pressure, voltage or temperature (PVT)), and is further adapted to reduce excess power consumption caused by standby leakage current.

In one embodiment, the invention provides a circuit adapted to reduce standby leakage current in a semiconductor memory device comprising memory cells. The circuit comprises a bias signal generator adapted to generate a bias signal, wherein a voltage level of the bias signal is set in accordance with a result of a standby leakage current test. The circuit further comprises a ground voltage controller connected between a ground terminal and a virtual ground terminal of at least one of the memory cells, adapted to receive the bias signal from the bias signal generator, and adapted to control a level of a voltage apparent on the virtual ground terminal in response to the bias signal while the semiconductor memory device is in a standby mode.

In another embodiment, the invention provides a circuit adapted to reduce a standby leakage current in a semiconductor memory device comprising memory cells. The circuit comprises a temperature information generator, and a bias signal generator electrically connected to the temperature information generator and adapted to generate a bias signal, wherein a voltage level of the bias signal is set in accordance with a temperature sensing signal output by the temperature information generator. The circuit further comprises a ground voltage controller connected between a ground terminal and a virtual ground terminal of at least one of the memory cells, adapted to receive the bias signal from the bias signal generator, and adapted to control a level of a voltage apparent on the virtual ground terminal in response to the bias signal while the semiconductor memory device is in a standby mode.

In yet another embodiment, the invention provides a semiconductor memory device comprising a plurality of memory cells, a temperature information generator, and a bias signal generator adapted to generate a bias signal and adapted to set a voltage level of the bias signal in accordance with a temperature sensing signal received from the temperature information generator and a result of a standby leakage current test. The semiconductor memory device further comprises a ground voltage controller connected between a ground terminal and a virtual ground terminal of at least one of the memory cells, adapted to receive the bias signal from the bias signal generator, and adapted to control a level of a voltage apparent on the virtual ground terminal in response to the bias signal while the semiconductor memory device is in a standby mode.

BRIEF DESCRIPTION OF THE DRAWINGS

Embodiments of the invention will be described herein with reference to the accompanying drawings, in which like reference symbols indicate like or similar elements. In the drawings:

FIG. 1A is a timing diagram illustrating timings for an exemplary entry of a conventional semiconductor memory device into a deep power down mode;

DESCRIPTION OF EMBODIMENTS

Figure 1B:
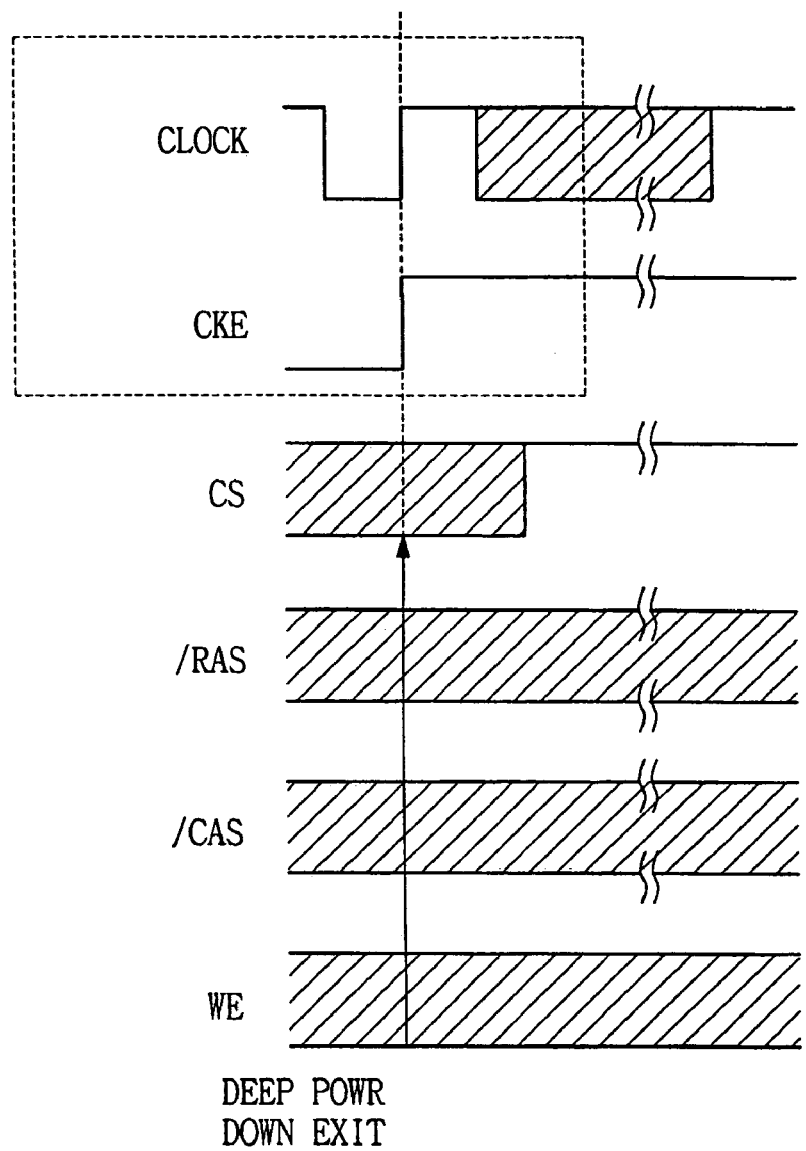
FIG. 1B is a timing diagram illustrating timings for an exemplary exit of a conventional semiconductor memory device from the deep power down mode.
Figure 2:
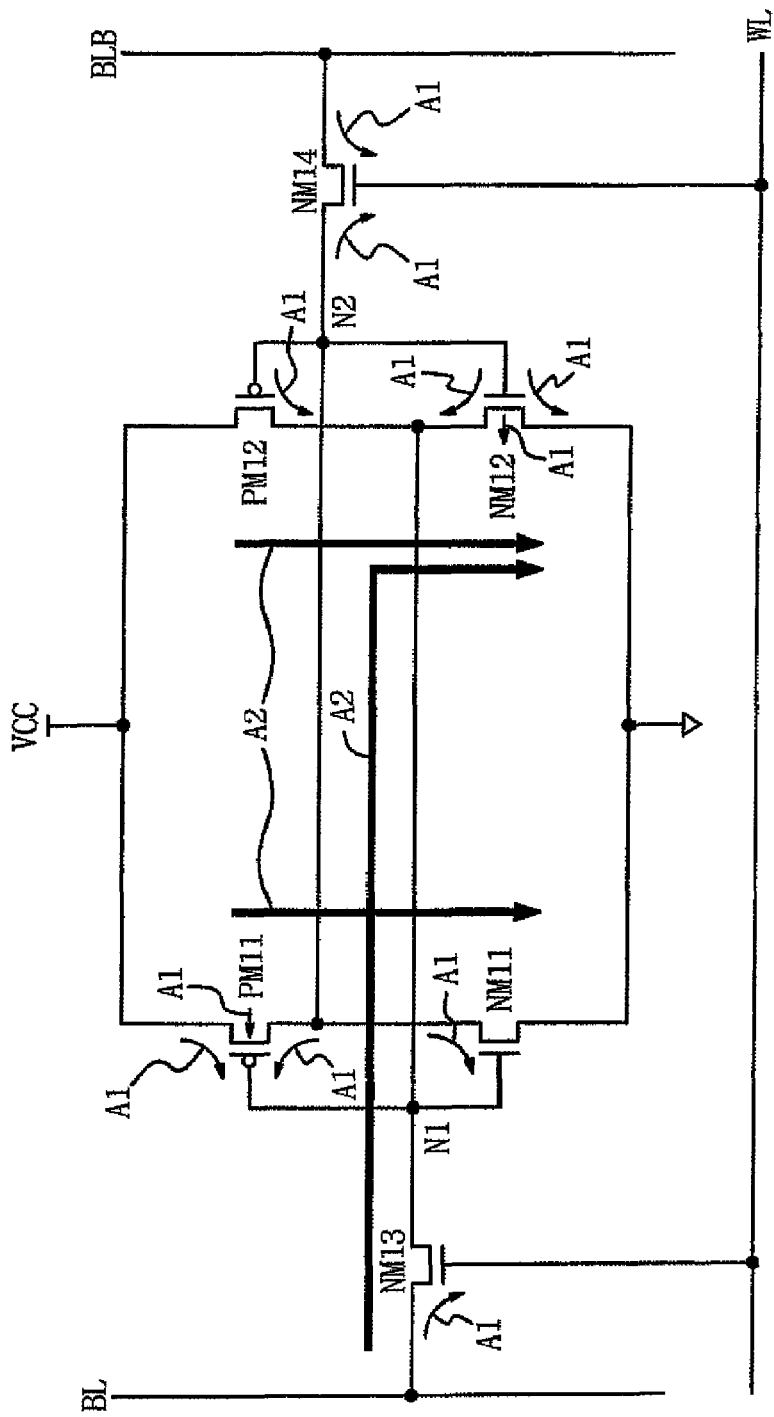
FIG. 2 is a circuit diagram illustrating standby leakage current in a portion of a conventional SRAM device.
Figure 3:
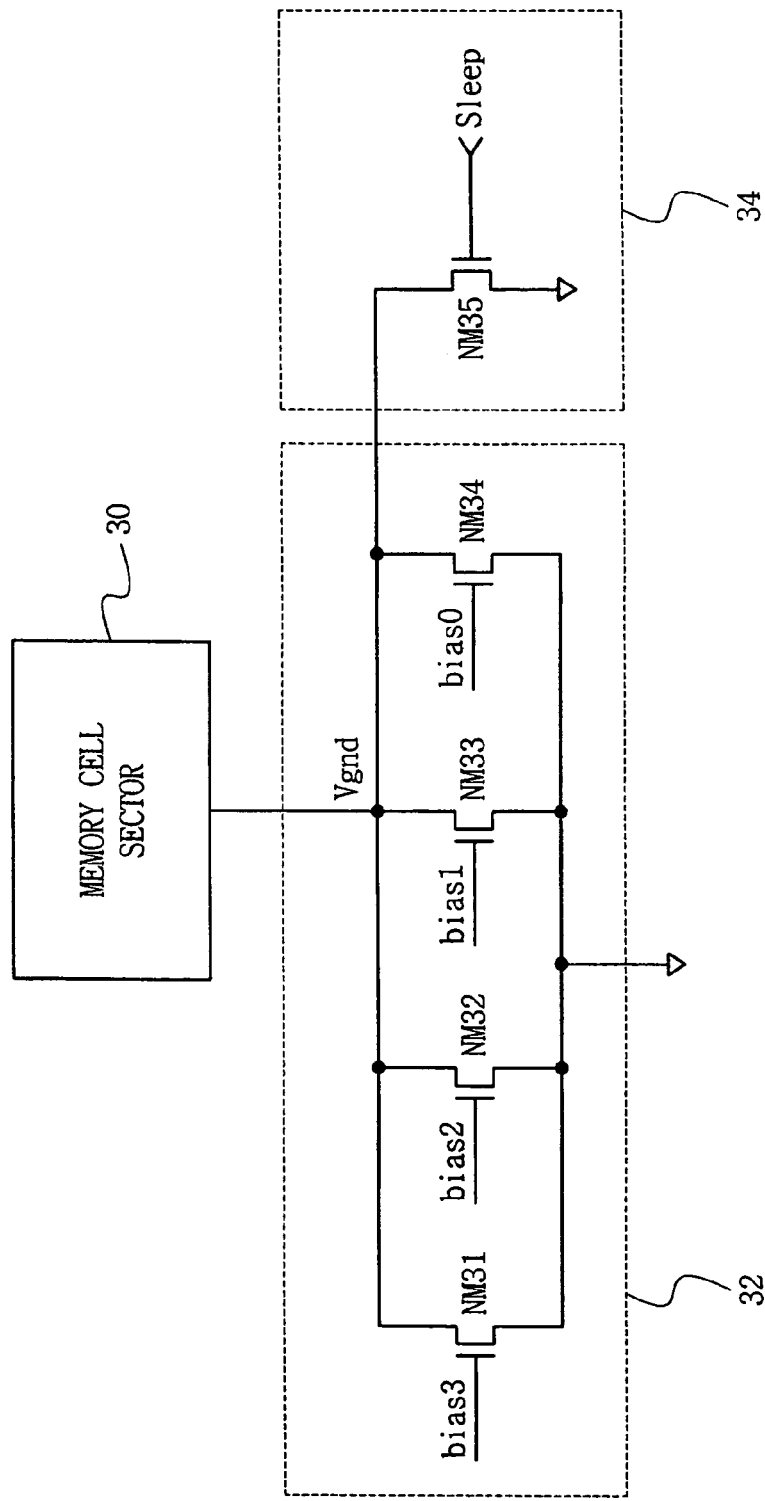
FIG. 3 is a circuit diagram illustrating a portion of an exemplary conventional SRAM device.
Figure 4:
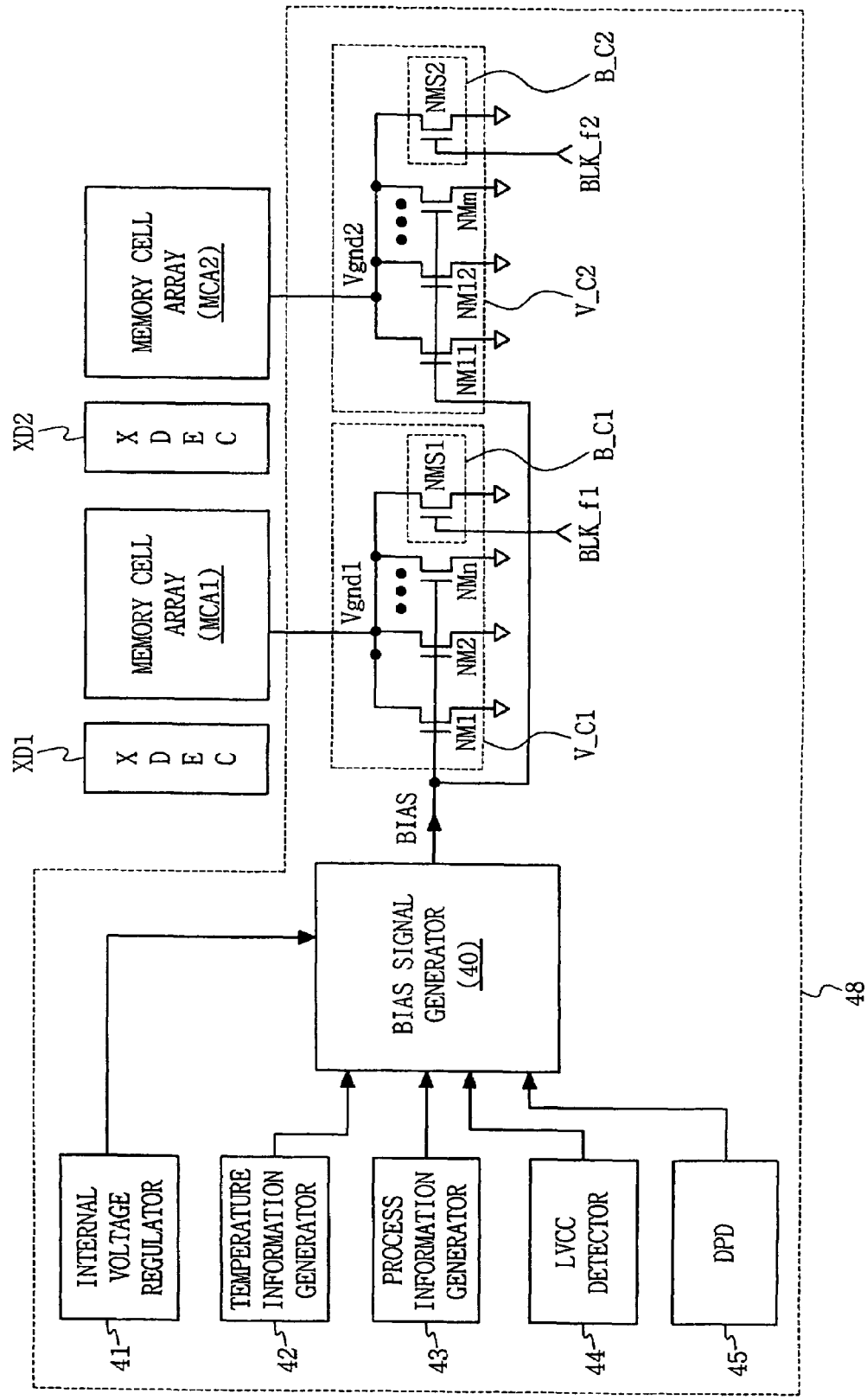
FIG. 4 schematically illustrates a semiconductor memory device in accordance with an embodiment of the invention that comprises a standby leakage current reduction circuit in accordance with an embodiment of the invention.

FIG. 4 schematically illustrates a semiconductor memory device in accordance with an embodiment of the invention that comprises a standby leakage current reduction circuit in accordance with an embodiment of the invention.

Referring to FIG. 4, a bias signal generator 40 operates in accordance with a voltage controlled by and received from an internal voltage regulator 41; receives signals output from a temperature information generator 42, a process information generator 43, an LVCC detector 44, and a deep power down setting unit 45; and generates and outputs a bias signal BIAS.

In addition, first ground voltage controller V_C1 receives bias signal BIAS and controls the level of the voltage apparent on first virtual ground terminal Vgnd1 of memory cells of first memory cell array MCA1. Similarly, second ground voltage controller V_C2 receives bias signal BIAS and controls the level of the voltage apparent on second virtual ground terminal Vgnd2 of memory cells of second memory cell array MCA2. As used herein, first virtual ground terminal Vgnd1 of memory cells of first memory cell array MCA1 may be referred to as simply "first virtual ground terminal Vgnd1," and second virtual ground terminal Vgnd2 of memory cells of second memory cell array MCA2 may be referred to as simply "second virtual ground terminal Vgnd2." In addition, first and second ground voltage controllers V_C1 and V_C2 may be referred to herein as first and second virtual ground controllers V_C1 and V_C2 because they control the respective levels of the voltages apparent on first and second virtual ground terminals Vgnd1 and Vgnd2.

Internal voltage regulator 41 provides a stabilized voltage to bias signal generator 40, and bias signal generator 40 needs the stabilized voltage provided by internal voltage regulator 41 in order to operate.

Temperature information generator 42 senses the temperature of the semiconductor memory device and provides temperature sensing signals to bias signal generator 40 in accordance with the sensed temperature. Bias signal generator 40 may influence the voltage level of bias signal BIAS, and thus the level of the voltage apparent on virtual ground terminal Vgnd, in accordance with the sensed temperature using the temperature information received from temperature information generator 42 through the temperature sensing signals. As used herein, the term "virtual ground terminal Vgnd" may mean one or both of first virtual ground terminal Vgnd1 and second virtual ground terminal Vgnd2. In addition, temperature information generator 42 may comprise a temperature sensor (see FIG. 6A) and a sensor output signal controller (see FIG. 6B). Temperature information generator 42 will be described more in detail with reference to FIGS. 6A and 6B subsequently.

Standby leakage current reduction circuit 48 may reduce standby leakage current of memory cells that results from process scatter using process information generator 43, which performs fuse cutting. Because process information generator 43 performs fuse cutting it may be referred to as a fuse cutting unit. Bias signal generator 40 may influence the voltage level of bias signal BIAS, and thus the level of the voltage apparent on virtual ground terminal Vgnd, in accordance with process scatter using the process information received from process information generator 43. Process information generator 43 (that is, the fuse cutting unit) may comprise a wafer level test path and a fuse cutting signal generating path. The fuse cutting unit will be described more in detail with reference to FIG. 7 subsequently.

LVCC detector 44 is a low power detector (low VCC detector) adapted to detect when a power source voltage is below a target voltage. When a power source voltage is below a target voltage and the level of the voltage apparent on virtual ground terminal Vgnd has been set higher than a ground voltage VSS, the difference (i.e., margin) between a low voltage and a high voltage in a semiconductor memory device may be relatively small, and that relatively small difference may be a relatively poor operating characteristic for the semiconductor memory device. That is, the relatively small difference may negatively impact the operation of the semiconductor memory device. Thus, when the power source voltage is found to be below the target voltage, LVCC detector 44 outputs an output signal LVCCD (see FIG. 5B) having a logic high level and first and second ground voltage controllers V_C1 and V_C2 each provide voltages approximately equal to ground voltage VSS to first and second virtual ground terminals Vgnd1 and Vgnd2, respectively, in accordance with output signal LVCCD of LVCC detector 44. LVCC detector 44 will be described more in detail with reference to FIG. 8 subsequently.

Deep power down setting unit 45 may set a deep power down mode of the semiconductor memory device. The deep power down mode has been described previously, so further description thereof will be omitted here.

First virtual ground controller V_C1 is connected between first virtual ground terminal Vgnd1 and at least one ground terminal VSS within the semiconductor memory device, and may control the level of the voltage apparent on first virtual ground terminal Vgnd1. First virtual ground controller V_C1 may comprise one or more NMOS transistors NM1 to NMn adapted to receive a bias signal BIAS generated by bias signal generator 40, and adapted to provide operational resistance within first virtual ground controller V_C1.

Similarly, second virtual ground controller V_C2 is connected between second virtual ground terminal Vgnd2 and at least one ground terminal VSS within the semiconductor memory device, and may control the level of the voltage apparent on second virtual ground terminal Vgnd2. Second virtual ground controller V_C2 may comprise one or more NMOS transistors NM11 to NMm adapted to receive a bias signal BIAS generated by bias signal generator 40, and adapted provide operational resistance within second virtual ground controller V_C2.

The operation of a field effect transistor (FET) may be generally classified into a saturation state, an active state (which is different than the active mode of a semiconductor memory device, which was described previously), and an isolation state. In the saturation state, the amount of current at a source terminal of the FET will no longer increase even when the amount of current at a gate terminal of the FET becomes relatively large. In the active state, the amount of current at the source terminal varies in accordance with variation in the amount of current at the gate terminal. In the isolation state, current does not flow in the source terminal when there is either a relatively very small amount of current or no current at the gate terminal.

When a low power margin maintaining unit G4 (of FIG. 5B) increases the voltage level of bias signal BIAS, NMOS transistors NM1 to NMn and NMOS transistors NM11 to NMm are each in the saturation state. When a virtual ground terminal float enabling gate G5 (of FIG. 5B) decreases the voltage level of bias signal BIAS, NMOS transistors NM1 to NMn and NMOS transistors NM1 to NMm are each in the isolation state. When low power margin maintaining unit G4 (of FIG. 5B) maintains the voltage level of bias signal BIAS and virtual ground terminal float enabling gate G5 (of FIG. 5B) does not decrease the voltage level of bias signal BIAS, NMOS transistor NM1 to NMn and NM11 to NMm are in the active state. In the active state, a voltage apparent on a drain terminal of each of NMOS transistors NM1 to NMn and NM11 to NMm, which is the voltage apparent on first virtual ground terminal Vgnd1 and second virtual ground terminal Vgnd2, respectively, varies in accordance with the voltage level of bias signal BIAS. That relationship is used in order to control the respective levels of the voltages apparent on first and second virtual ground terminals Vgnd1 and Vgnd2 in accordance with the embodiment of the invention illustrated in FIG. 4. One operational resistance is a resistance value calculated in accordance with the voltage apparent on first virtual ground terminal Vgnd1 when NMOS transistors NM1 to NMn are in the active state and in accordance with the amount of current flowing between the drain and source terminals of NMOS transistors NM1 to NMn. Another operational resistance is a resistance value calculated in accordance with the voltage apparent on second virtual ground terminal Vgnd2 when NMOS transistors NM11 to NMm are in the active state and in accordance with the amount of current flowing between the drain and source terminals of NMOS transistors NM1 to NMm.

The number of NMOS transistors NM1 to NMn and NM11 to NMm may be varied. First and second virtual ground controllers V_C1 and V_C2 may be classified as mat units, sub-mat units, block units, etc. Thus, the number of first and second virtual ground controllers V_C1 and V_C2 may vary in accordance with the number of mats, sub-mats, or blocks. Also, the placement of first and second virtual ground controllers V_C1 and V_C2 within a semiconductor memory device may be varied. The placement of virtual ground controllers V_C1 and V_C2 in a semiconductor memory device will be described with reference to FIGS. 11 to 13 subsequently.

First and second virtual ground controllers V_C1 and V_C2 may comprise first and second block controllers B_C1 and B_C2, respectively.

First and second block controllers B_C1 and B_C2 receive first and second block control signals BLK_f1 and BLK_f2, respectively, during an active mode (of the semiconductor memory device). Thus, first and second virtual ground terminals Vgnd1 and Vgnd2 each have a second voltage. The second voltage is provided to first and second virtual ground terminals Vgnd1 and Vgnd2 when first and second block controllers B_C1 and B_C2 receive first and second block control signals BLK_f1 and BLK_f2, respectively, and are thereby turned ON. The second voltage is approximately equal to ground voltage VSS. First block controller B_C1 may comprise an NMOS transistor NMS1, wherein first block control signal BLK_f1 is applied to the gate of NMOS transistor NMS1. Similarly, second block controller B_C2 may comprise an NMOS transistor NMS2, wherein second block control signal BLK_f2 is applied to the gate of NMOS transistor NMS2.

In the embodiment illustrated in FIG. 4, when first block control signal BLK_f1 has a logic high level, first virtual ground terminal Vgnd1, which corresponds to first memory cell array MCA1, is set to a ground voltage VSS. Also when first block control signal BLK_f1 has a logic high level, the influence of NMOS transistors NM1 to NMn may be disregarded since the voltage of first virtual ground terminal Vgnd1 is largely affected by NMOS transistor NMS1, which is in an active state. Thus, NMOS transistor NMS1 should be designed so that the driving capability of NMOS transistor NMS1 is greater than the driving capability of NMOS transistor NM1 to NMn. First memory cell array MCA1 may herein be a unit of mat, sub-mat, or block. When first block control signal BLK_f1 has a logic low level, memory cell array MCA1 is in a standby mode, and NMOS transistor NMS1 is turned OFF; thus, the voltage level of first virtual ground terminal Vgnd1 is controlled in accordance with NMOS transistors NM1 to NMn. As used herein, when a signal, voltage, or terminal is said to be "set to" or is said to "transition to" a first voltage or logic level, if the signal, voltage, or terminal already has the first voltage or logic level when it is said to be set to or said to transition to the first voltage or logic level, then the signal, voltage, or terminal simply continues to have the first voltage or logic level after it is "set to" or "transitions to" that voltage or logic level.

In the embodiment illustrated in FIG. 4, operation of second virtual ground controller V_C2 when second block control signal BLK_f2 has a logic high level or a logic low level is the same as the previously-described operation of first virtual ground controller V_C1 when first block control signal BLK_f1 has a logic high level or a logic low level, respectively. Thus, a detailed description of the operation of second virtual ground controller V_C2 when second block control signal BLK_f2 has a logic high level or a logic low level will be omitted here.

Figure 5A:
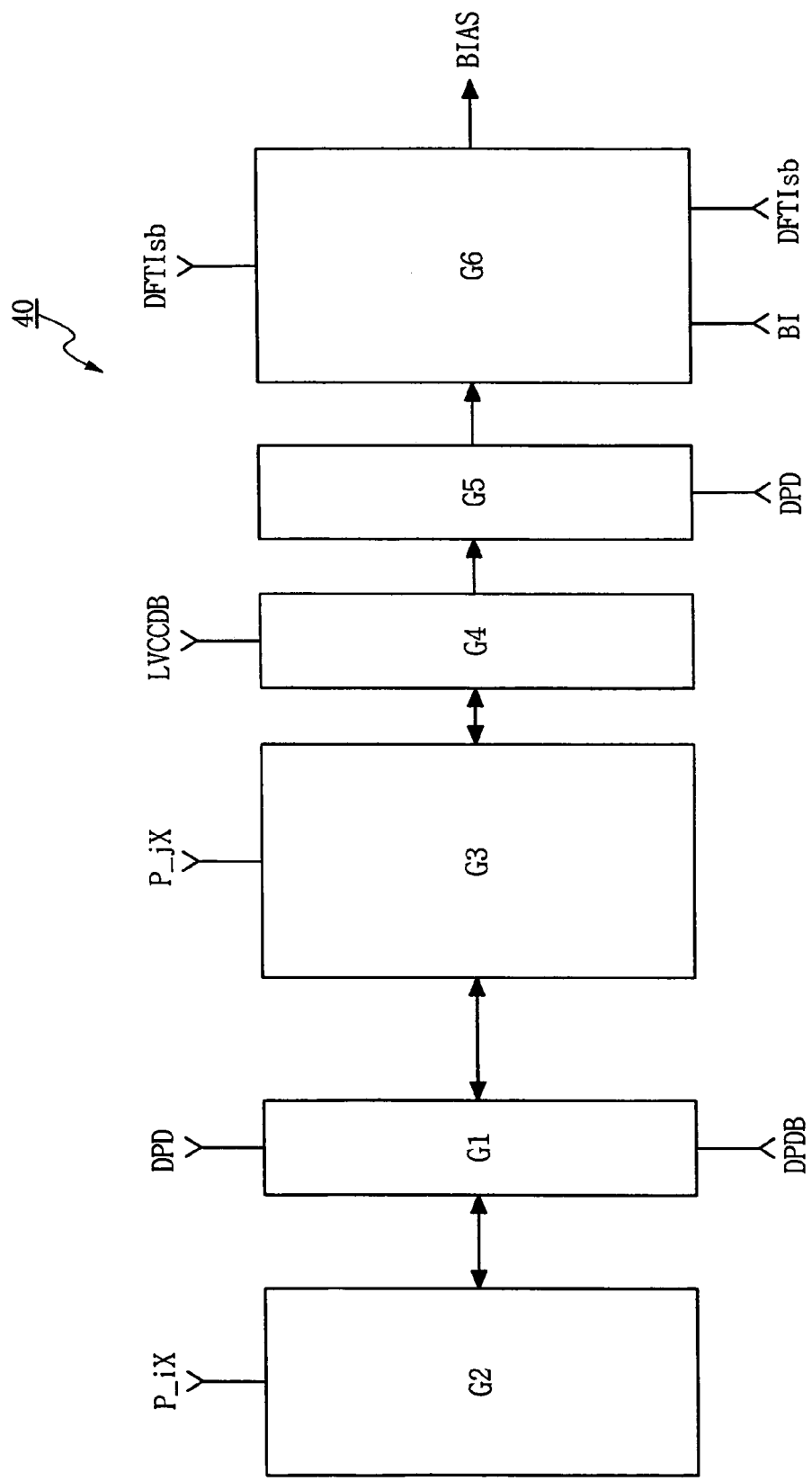
FIG. 5A illustrates the configuration of the bias signal generator shown in FIG. 4.
Figure 5B:
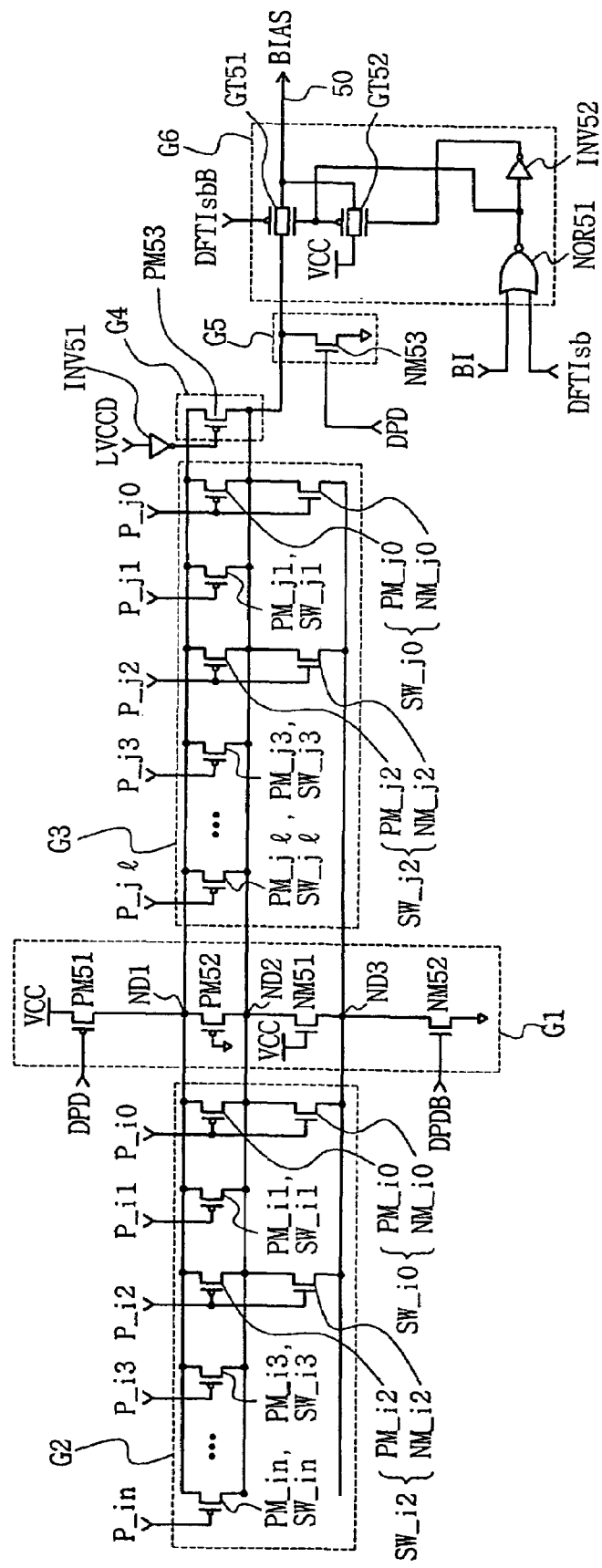
FIG. 5B is a circuit diagram of the bias signal generator illustrated in FIGS. 4 and 5A.

FIG. 5A illustrates the configuration of bias signal generator 40 shown in FIG. 4, and FIG. 5B is a circuit diagram of bias signal generator 40 illustrated in FIGS. 4 and 5A.

Referring to FIGS. 5A and 5B, bias signal generator 40 comprises a default voltage setting unit G1, a first bias voltage controller G2, a second bias voltage controller G3, a low power margin maintaining unit G4, a virtual ground terminal float enabling gate G5, and a mode switching unit G6.

Default voltage setting unit G1 sets the default voltages of a first node ND1, a second node ND2, and a third node ND3. First node ND1, second node ND2, and third node ND3 are each electrically connected within default voltage setting unit G1, and are each electrically connected to first bias voltage controller G2, and second bias voltage controller G3. Second node ND2 is electrically connected to mode switching unit G6, and is electrically connected to an output terminal 50 for bias signal BIAS (i.e., a bias signal BIAS output terminal 50) when a transmission gate GT51 of mode switching unit G6 is turned ON (i.e., second node ND2 is selectively electrically connected to bias signal BIAS output terminal 50).

Default voltage setting unit G1 may comprise a first PMOS transistor PM51, a second PMOS transistor PM52, a first NMOS transistor NM51, and a second NMOS transistor NM52. First PMOS transistor PM51 is connected between power source voltage VCC and first node ND1. A deep power down signal DPD is applied to the gate terminal of first PMOS transistor PM51. Second PMOS transistor PM52 is connected between first node ND1 and second node ND2. Ground voltage VSS is applied to the gate terminal of second PMOS transistor PM52. First NMOS transistor NM51 is connected between second node ND2 and third node ND3. Power source voltage VCC is applied to the gate terminal of first NMOS transistor NM51. Second NMOS transistor NM52 is connected between third node ND3 and ground voltage VSS. An inverted deep power down signal DPDB (which is an inverted version of deep power down signal DPD) is applied to the gate terminal of second NMOS transistor NM52.

When the semiconductor memory device is in an active mode or a standby mode, deep power down signal DPD has a logic low level, so first PMOS transistor PM51 is turned ON and first node ND1 receives a power source voltage VCC.

When the semiconductor memory device is in the deep power down mode, deep power down signal DPD has a logic high level, so first PMOS transistor PM51 is turned OFF.

A gate terminal of second PMOS transistor PM52 is grounded, so second PMOS transistor PM52 is always turned ON. In addition, power source voltage VCC is applied to a gate terminal of first NMOS transistor NM51, so first NMOS transistor NM51 is also always turned ON.

When the semiconductor memory device is in the active mode or the standby mode, that is, when inverted deep power down signal DPDB has a logic high level, second NMOS transistor NM52 is turned ON, so third node ND3 has a ground voltage VSS when inverted deep power down signal DPDB has a logic high level. When the semiconductor memory device is in a deep power down mode, inverted deep power down signal DPDB has a logic low level, so second NMOS transistor NM52 is turned OFF.

When the semiconductor memory device is in the active mode or the standby mode, second node ND2 has a default voltage because it is connected to second PMOS transistor PM52 and first NMOS transistor NM51, which are each turned ON. That is, the voltage apparent between first node ND1 and third node ND3 is distributed in accordance with the respective operational resistances of second PMOS transistor PM52 and first NMOS transistor NM51, and second node ND2 thereby has a default voltage.

First bias voltage controller G2 may comprise voltage control sub-switches SW_i0 to SW_in, which may be divided into first voltage control sub-switches SW_iE, which are the voltage control sub-switches of voltage control sub-switches SW_i0 to SW_in having a 0 or an even number as an index (i.e., SW_i0, SW_i2 . . . ) and second voltage control sub-switches SW_iO, which are the voltage control sub-switches of voltage control sub-switches SW_i0 to SW_in having an odd number as an index (i.e., SW_i1, SW_i3 . . . ). As used herein, "E" is 0 or a positive, even integer, "O" is a positive, odd integer, and "n" is a positive integer (that is greater than 3 in the embodiment illustrated in FIG. 5B). In addition, first voltage control sub-switches SW_iE may be referred to collectively as a first voltage control switch SW_iE, and second voltage control sub-switches SW_iO may be referred to collectively as a second voltage control switch SW_iO. Also, each control switch may be referred to herein as comprising its corresponding sub-switches.

Each of first voltage control sub-switches SW_iE of first voltage control switch SW_iE is adapted to increase or decrease a voltage level apparent on second node ND2 in response to a first temperature sensing signal P_iE (comprising first temperature sensing sub-signals P_i0, P_i2, . . . ) output from temperature information generator 42 (of FIG. 4). Increasing or decreasing the level of the voltage apparent on second node ND2 increases or decreases, respectively, the voltage level of bias signal BIAS. As a result, first voltage control sub-switches SW_iE are adapted to increase or decrease the voltage level of bias signal BIAS. When a sub-switch is described as being adapted to increase the level of a voltage, it means that the sub-switch influences the level of the voltage in a positive direction, while, in the aggregate, the level of the voltage may not actually change in the positive direction due to other influences on the level of the voltage. Similarly, when a sub-switch is described as being adapted to decrease the level of a voltage, it means that the sub-switch influences the level of the voltage in a negative direction, while, in the aggregate, the level of the voltage may not actually change in the negative direction due to other influences on the level of the voltage.

First voltage control switch SW_iE may comprise PMOS transistors PM_iE (i.e., PMOS transistors PM_i0, PM_i2, . . . ) such that first voltage control sub-switches SW_i0, SW_i2, . . . comprise PMOS transistors PM_i0, PM_i2, . . . , respectively. Each PMOS transistor PM_ia of PMOS transistors PM_iE is adapted to increase the level of the voltage apparent on second node ND2 when a corresponding one of first temperature sensing sub-signals P_iE (i.e., a first temperature sensing sub-signal P_ia that corresponds to a first voltage control sub-switch SW_ia comprising PMOS transistor PM_ia) has a logic low level. As used herein, "a" is 0 or a positive, even integer less than or equal to "n". First voltage control switch SW_iE may also comprise NMOS transistors NM_iE (i.e., NMOS transistors NM_i0, NM_i2, . . . ) such that first voltage control sub-switches SW_i0, SW_i2, . . . comprise NMOS transistors NM_i0, NM_i2, . . . , respectively. Each NMOS transistor NM_ia of NMOS transistors NM_iE is adapted to decrease the level of the voltage apparent on second node ND2 when a corresponding one of first temperature sensing sub-signals P_iE (i.e., a first temperature sensing sub-signal P_ia that corresponds to first voltage control sub-switch SW_ia comprising NMOS transistor NM_ia) has a logic high level.

Each of second voltage control sub-switches SW_iO of second voltage control switch SW_iO is adapted to increase the level of the voltage apparent on second node ND2 or not in response to a second temperature sensing signal P_iO (comprising second temperature sensing sub-signals P_i1, P_i3, . . . ) output from temperature information generator 42 (of FIG. 4). Increasing the level of the voltage apparent on second node ND2 in accordance with second voltage control sub-switches SW_iO increases the voltage level of bias signal BIAS. Thus, second voltage control sub-switches SW_iO are adapted to increase the voltage level of bias signal BIAS. Unlike first voltage control sub-switches SW_iE, second voltage control sub-switches SW_iO are not adapted to decrease the level of the voltage apparent on second node ND2 and thereby decrease the voltage level of bias signal BIAS. Rather, second voltage control sub-switches SW_iO either increase the level of the voltage apparent on second node ND2 and thereby increase the voltage level of bias signal BIAS, or do not influence the level of the voltage apparent on second node ND2 or the voltage level of bias signal BIAS.

Second voltage control switch SW_iO may comprise a PMOS transistors PM_iO (i.e., PMOS transistors PM_i1, PM_i3, . . . ) such that second voltage control sub-switches SW_i1, SW_i3, . . . comprise PMOS transistors PM_i1, PM_i3, . . . , respectively. Each PMOS transistor PM_ib of PMOS transistors PM_iO is adapted to increase the level of the voltage apparent on second node ND2 when a corresponding one of second temperature sensing sub-signals P_iO (i.e., a second temperature sensing sub-signal P_ib that corresponds to a second voltage control sub-switch SW_ib comprising PMOS transistor PM_ib) has a logic low level. As used herein, "b" is a positive, odd integer less than or equal to "n".

The number of first and second temperature sensing sub-signals P_i0 to P_in may be varied. If, for example, there are a total of first and second eight temperature sensing sub-signals P_i0 to P_in, then the first voltage control sub-switches are SW_i0, SW_i2, SW_i4, and SW_i6; the second voltage control sub-switches are SW_i1, SW_i3, SW_i5, and SW_i7; and n is 7. In the preceding example, first bias voltage controller G2 comprises four first voltage control sub-switches SW_iE and four second voltage control sub-switches SW_iO; however, the eight voltage control sub-switches SW_i0 to SW_i7, which correspond to first and second temperature sensing sub-signals P_i0 to P_i7, respectively, may be divided into a different ratio of first and second voltage control sub-switches SW_iE and SW_iO. For example, the eight voltage control sub-switches SW_i0 to SW_i7 may be divided into a ratio (expressed as the number of first voltage control sub-switches SW_iE/the number second voltage control sub-switches SW_iO) of eight/zero, seven/one, six/two, five/three, three/five, two/six, one/seven, or zero/eight. In addition, second voltage control sub-switches SW_iO may be substantially the same as (i.e., may be the same type as) first voltage control sub-switches SW_iE.

First bias voltage controller G2 receives temperature sensing signal P_i (comprising temperature sensing sub-signals P_i0 to P_in and thus first and second temperature sensing signals P_iE and P_iO), which is output from temperature information generator 42 (of FIG. 4), and influences the voltage level of bias signal BIAS. Because first bias voltage controller G2 influences the voltage level of bias signal BIAS, first bias voltage controller G2 influences the voltage level of first virtual ground terminal Vgnd1 and second virtual ground terminal Vgnd2 (each of FIG. 4).

Exemplary operations of first bias voltage controller G2 will now be described with reference to FIG. 5B. In the following examples, it will be assumed that first bias voltage controller G2 receives eight temperature sensing sub-signals P_i0 to P_i7. If temperature sensing sub-signal P_i0 has a logic low level and temperature sensing sub-signals P_i1 to P_i7 each have a logic high level (so a binary representation (i.e., a logic combination) of the logic levels of temperature sensing sub-signals P_i0 to P_i7 is '01111111'), PMOS transistor PM_i0 is turned ON and NMOS transistors NM_i2, NM_i4, NM_i6 of first voltage control sub-switches SW_i2, SW_i4, SW_i6, respectively, are turned ON. Thus, the level of the voltage apparent on second node ND2, which is a voltage apparent between first node ND1 and third node ND3, is influenced by first bias voltage controller G2 (i.e., is divided and varied). Though they are not shown in FIG. 5B, first voltage control sub-switches SW_i4 and SW_i6 are each substantially the same as first voltage control sub-switch SW_i0, and NMOS transistors NM_i4 and NM_i6 of first voltage control sub-switches SW_i4 and SW_i6 are each substantially the same as NMOS transistor NM_i0 of voltage control sub-switch SW_i0.

If, in accordance with another example, the binary representation of the logic levels of temperature sensing sub-signals P_i0 to P_i7 is '01011111', PMOS transistor PM_i0, PMOS transistor PM_i2, NMOS transistor NM_i4, and NMOS transistor NM_i6 are each turned ON. If, in accordance with still another example, the binary representation of the logic levels of temperature sensing sub-signals P_i0 to P_i7 is '10000000', PMOS transistors PM_i1 to PM_i7 are all turned ON and NMOS transistor NM_i0 is turned ON.

In the examples described above, a PMOS transistor receiving a temperature sensing signal having a voltage level corresponding to a logic '0' bit in the binary (i.e., logical) representation of the logic levels of temperature sensing sub-signals P_i0 to P_i7 is turned ON, and an NMOS transistor receiving the same or an equivalent signal (i.e., a signal having a voltage level corresponding to logic '0') is turned OFF. In addition, a PMOS transistor receiving a temperature sensing signal having a voltage level corresponding to a logic '1' bit in the binary (i.e., logical) representation of the logic levels of temperature sensing signals P_i0 to P_i7 is turned OFF, and an NMOS transistor receiving the same or an equivalent signal (i.e., a signal having a voltage level corresponding to logic '1') is turned ON. Thus, the level of the voltage apparent on second node ND2 can be influenced in accordance with the number of logic '0' bits and logic '1' bits present in the binary (i.e., logical) representation of the logic levels of temperature sensing signals P_i0 to P_i7.

First bias voltage controller G2 influences the level of the voltage apparent on second node ND2, and thereby influences the voltage level of bias signal BIAS, in accordance with the logic levels of temperature sensing sub-signals P_i0 to P_in.

Second bias voltage controller G3 receives a fuse cutting signal P_j corresponding to the result of a standby leakage current test performed on memory cells of the semiconductor memory device, and influences the voltage level of bias signal BIAS. Fuse cutting signal P_j comprises fuse cutting sub-signals P_j0 to P_jl, which may be divided into first fuse cutting sub-signals P_j0, P_j2, . . . (i.e., first fuse cutting sub-signals P_jE) and second fuse cutting sub-signals P_j1 to P_jl (i.e., second fuse cutting sub-signals P_jO). First fuse cutting sub-signals P_jE may be referred to collectively as a first fuse cutting signal P_jE, and second fuse cutting sub-signals P_jO may be referred to collectively as second fuse cutting signal P_jO. First and second fuse cutting sub-signals P_j0 to P_jl are generated by a fuse cutting unit (i.e., process information generator 43 of FIG. 4).

Second bias voltage controller G3 may comprise voltage control sub-switches SW_j0 to SW_jl, which may be divided into third voltage control sub-switches SW_jE, which are the voltage control sub-switches of voltage control sub-switches SW_j0 to SW_jl having a 0 or an even number as an index (i.e., SW_j0, SW_j2 . . . ) and third voltage control sub-switches SW_jO, which are the voltage control sub-switches of voltage control sub-switches SW_j0 to SW_jl having an odd number as an index (i.e., SW_j1, SW_j3 . . . ). As used herein, "l" is a positive integer (that is greater than 3 in the embodiment illustrated in FIG. 5B). In addition, third voltage control sub-switches SW_jE may be referred to collectively as a third voltage control switch SW_jE, and fourth voltage control sub-switches SW_jO may be referred to collectively as a fourth voltage control switch SW_jO. Also, each control switch may be referred to herein as comprising its corresponding sub-switches.

Third voltage control sub-switches SW_jE are adapted to receive first fuse cutting signal P_jE (i.e., third voltage control sub-switches SW_j0, SW_j2, . . . are adapted to receive first fuse cutting sub-signals P_j0, P_j2, . . . ) and increase or decrease the voltage level of bias signal BIAS in response to first fuse cutting signal P_jE. Fourth voltage control sub-switches SW_jO are adapted to receive second fuse cutting signal P_jO (i.e., fourth voltage control sub-switches SW_j1, SW_j3, . . . are adapted to receive third fuse cutting sub-signals P_j1, P_j3, . . . ) and increase or decrease the voltage level of bias signal BIAS in response to second fuse cutting signal P_jO.

In the embodiment illustrated in FIG. 5B, third voltage control switch SW_jE comprises PMOS transistors PM_jE (i.e., PMOS transistors PM_j0, PM_j2, . . . ) such that third voltage control sub-switches SW_j0, SW_j2, . . . comprise PMOS transistors PM_j0, PM_j2, . . . , respectively. In addition, PMOS transistors PM_jE are adapted to operate in response to first fuse cutting signal P_jE and are adapted to increase the voltage level of bias signal BIAS. That is, each PMOS transistor PM_jc is turned ON or turned OFF in accordance with a corresponding first fuse cutting sub-signal P_jc applied to the gate terminal of PMOS transistor PM_jc. When a PMOS transistor PM_jc is turned ON, the voltage level of bias signal BIAS increases. As used herein, "c" is 0 or a positive, even integer less than or equal to "n".

Also in the embodiment illustrated in FIG. 5B, third voltage control switch SW_jE comprises NMOS transistors NM_jE (i.e., NMOS transistors NM_j0, NM_j2, . . . ) such that third voltage control sub-switches SW_j0, SW_j2, . . . comprise NMOS transistors NM_j0, NM_j2, . . . , respectively. In addition, NMOS transistors NM_jE are adapted to operate in response to first fuse cutting signal P_jE and are adapted to decrease the voltage level of bias signal BIAS. That is, each NMOS transistor NM_jc is turned ON or turned OFF in accordance with a corresponding first fuse cutting sub-signal P_jc applied to the gate terminal of NMOS transistor NM_jc. When a NMOS transistor NM_jc is turned ON, the voltage level of bias signal BIAS decreases.

In addition, in the embodiment illustrated in FIG. 5B, fourth voltage control switch SW_jO comprises PMOS transistors PM_jO (i.e., PMOS transistors PM_j1, PM_j3, . . . ) such that third voltage control sub-switches SW_j1, SW_j3, . . . comprise PMOS transistors PM_j1, PM_j3, . . . , respectively. In addition, PMOS transistors PM_jO are adapted to operate in response to second fuse cutting signal P_jO and are adapted to increase the voltage level of bias signal BIAS. That is, each PMOS transistor PM_jd is turned ON or turned OFF in accordance with a corresponding second fuse cutting sub-signal P_jd applied to the gate terminal of PMOS transistor PM_jd. When a PMOS transistor PM_jd is turned ON, the voltage level of bias signal BIAS increases. When a PMOS transistor PM_jd is turned OFF, PMOS transistor PM_jd does not influence the voltage level of bias signal BIAS. As used herein, "d" is a positive, odd integer less than or equal to "l".

The number of first and second fuse cutting sub-signals P_j0 to P_jl and the number of third and fourth voltage control sub-switches SW_j0 to SW_jl may be varied. If there are a total of eight first and second fuse cutting sub-signals P_j0 to P_jl (i.e., P_j0 to P_j7), second bias voltage controller G3 may comprise a total of eight third and fourth voltage control sub-switches SW_j0 to SW_jl (i.e., SW_j0 to SW_j7), and the ratio third voltage control sub-switches SW_iE to fourth voltage control sub-switches SW_iO (expressed as the number of third voltage control sub-switches SW_iE/the number of fourth voltage control sub-switches SW_iO) may be any one of eight/zero, seven/one, six/two, five/three, four/four, three/five, two/six, one/seven and zero/eight. In addition, fourth voltage control sub-switches SW_jO may be substantially the same as (i.e., may be the same type as) third voltage control sub-switches SW_jE.

Exemplary operations of second bias voltage controller G3 in accordance with exemplary inputs will now be described with reference to FIG. 5B. In the following examples, it will be assumed that second bias voltage controller G3 receives eight fuse cutting sub-signals P_j0 to P_j7. In one example, the binary (i.e., logical) representation of the logic levels of the eight signals is '01111111', indicating that only fuse cutting sub-signal P_j0 has a logic high level, so PMOS transistor PM_j0 and NMOS transistors NM_j2, NM_j4, and NM_j6 of third voltage control switch SW_jE (comprising third voltage control sub-switches SW_j0, SW_j2, SW_j4, SW_j6) are turned ON. Though they are not shown in FIG. 5B, NMOS transistors NM_j4 and NM_j6 of third voltage control sub-switches SW_j4 and SW_j6 are each substantially the same as NMOS transistor NM_j0 of third voltage control sub-switch SW_j0. Thus, the voltage apparent between first node ND1 and third node ND3 is divided by the operational resistance of PMOS transistor PM_j0 and NMOS transistors NM_j2, NM_j4, and NM_j6. That is, the level of the voltage apparent on second node ND2 may be changed.

When the level of the voltage apparent on second node ND2 is changed, the voltage level of bias signal BIAS is thereby changed. When the voltage level of bias signal BIAS is changed, the voltage level of virtual ground terminal Vgnd of memory cells may be thereby changed. Thus, standby leakage current can be influenced in accordance with fuse cutting signal P_j.

If, in accordance with another example, the binary (i.e., logical) representation of the logic levels of fuse cutting sub-signals P_j0 to P_j7 is '00111111', PMOS transistor PM_j0, PMOS transistor PM_j1, and NMOS transistors NM_j2, NM_j4, and NM_j6 are turned ON. If, in accordance with yet another example, the binary (i.e., logical) representation of the logic levels of fuse cutting sub-signals P_j0 to P_j7 is '10000000', PMOS transistors PM_j1 to PM_j7 are turned ON and NMOS transistor NM_j0 is turned ON.

As illustrated in the preceding examples, a PMOS transistor receiving a fuse cutting sub-signal having a voltage level corresponding to logic '0' in the binary representation of the logic levels of fuse cutting sub-signals P_j0 to P_j7 is turned ON and an NMOS transistor receiving the same or an equivalent signal (i.e., a signal having a voltage level corresponding to logic '0') is turned OFF. In addition, a PMOS transistor receiving a fuse cutting sub-signal having a value corresponding to logic '1' in the binary representation of the logic levels of fuse cutting sub-signals P_j0 to P_j7 is turned OFF and an NMOS transistor receiving the same or an equivalent signal (i.e., a signal having a voltage level corresponding to logic '1') is turned ON. Thus, the level of the voltage apparent on second node ND2 can be influenced in accordance with the number of logic '0' bits and the number of logic '1' bits present in the binary representation the logic levels of fuse cutting sub-signals P_j0 to P_j7.

Second bias voltage controller G3 influences the level of the voltage apparent on second node ND2 in accordance with the respective voltage levels of fuse cutting sub-signals P_j0 to P_jl, and thereby influences the voltage level of bias signal BIAS in accordance with the respective voltage levels of fuse cutting sub-signals P_j0 to P_jl.

Low power margin maintaining unit G4 receives output signal LVCCD from low power (LVCC) detector 44 (of FIG. 4). Low power margin maintaining unit G4 may increase the voltage level of bias signal BIAS to a voltage level sufficient to turn ON NMOS transistors NM1 to NMn and NM11 to NMm (of FIG. 4). The voltage level of bias signal BIAS may increase to a voltage level sufficient to bring NMOS transistors NM1 to NMn and NM11 to NMm to the saturation state. In the saturation state, when the level of the current apparent at gate terminals of NMOS transistors NM1 to NMn and NM11 to NMm varies while NMOS transistors NM1 to NMn and NM11 to NMm are turned ON, the level of the current flowing in the source terminals of NMOS transistors NM1 to NMn and NM11 to NMm does not vary.

Low power detector 44 (of FIG. 4) detects when a voltage is below a target voltage level and outputs output signal LVCCD.

An exemplary operation of low power margin maintaining unit G4 will now be described. When, for example, the level of a power source voltage drops below the target voltage level, output signal LVCCD of low voltage detector 44 (of FIG. 4) transitions to a logic high level. An inverter INV51 receives output signal LVCCD, inverts output signal LVCCD, and outputs the inverted signal to the gate terminal of PMOS transistor PM53. Thus, when output signal LVCCD has a logic high level, PMOS transistor PM53 is turned ON and the voltage level of second node ND2 becomes substantially equal to the voltage level of first node ND1. The voltage level of first node ND1 is approximately equal to a power source voltage VCC, so the voltage level of second node ND2 becomes approximately equal to power source voltage VCC. Thus, the voltage level of bias signal BIAS also becomes approximately equal to power source voltage VCC, and all of NMOS transistors NM1 to NMn and NM11 to NMm (of FIG. 4) are thereby turned ON. The voltage levels of first and second virtual ground terminals Vgnd1 and Vgnd2 thereby becomes substantially the same as the voltage level of ground voltage VSS. When the voltage levels of first and second virtual ground terminals Vgnd1 and Vgnd2 become substantially the same as the voltage level of ground voltage VSS, the difference between the voltage level of ground voltage VSS and each of first and second virtual ground terminals Vgnd1 and Vgnd2 may be under 20 mV.

Thus, when power source voltage VCC is below a target voltage level, low power margin maintaining unit G4 turns on all of NMOS transistors NM1 to NMn and NM11 to NMm (of FIG. 4) regardless of temperature information or process information. As a result, the voltage levels apparent on each of first and second virtual ground terminals Vgnd1 and Vgnd2 become approximately equal to ground voltage VSS to produce an adequate margin(s) between power source voltage VCC and the voltages apparent on first and second virtual ground terminals Vgnd1 and Vgnd2. Thus, an operating characteristic (i.e., the operating characteristic corresponding to the margin(s) described above) of a semiconductor memory device having a low power source voltage may be improved.

NMOS transistors NM1 to NMn and NM11 to NMm (of FIG. 4) are turned OFF in deep power down mode by virtual ground terminal float enabling gate G5. When deep power down signal DPD has a logic high level, virtual ground terminal float enabling gate G5 causes the voltage level of second node ND2 to become approximately equal to ground voltage VSS. Thus, the voltage level of bias signal BIAS is set to a logic low level, and NMOS transistors NM1 to NMn and NM11 to NMm (of FIG. 4) are turned OFF. Thus, NMOS transistors NM1 to NMn and NM11 to NMm (of FIG. 4) each enter the isolation state. Also, in response to bias signal BIAS having a logic low level, first and second virtual ground controllers V_C1 and V_C2 allow first and second virtual ground terminals Vgnd1 and Vgnd2 to float.

In deep power down mode, the levels of the voltages apparent on first and second virtual ground terminals Vgnd1 and Vgnd2 are approximately equal to power source voltage VCC, which is why the leakage suffered by memory cells is greater than the leakage suffered by of NMOS transistors NM1 to NMn and NM11 to NMm of FIG. 4. Also, because the voltage level apparent on first and second virtual ground terminals Vgnd1 and Vgnd2 shifts to a voltage level approximately equal to power source voltage VCC, a leakage current from the memory cells may be maintained at almost zero.

Mode switching unit G6 controls the levels of the voltages apparent on first and second virtual ground terminals Vgnd1 and Vgnd2 so that a first voltage is apparent on each of first and second virtual ground terminals Vgnd1 and Vgnd2 during a test mode, thereby reducing error in a standby leakage current test performed on memory cells. The first voltage is approximately equal to a ground voltage. The difference between the voltage level of the first voltage and the voltage level of ground voltage VSS may be under 10 mV, for example. During a standby mode, mode switching unit G6 provides the voltage apparent on second node ND2 to a bias signal BIAS output terminal 50. Then, mode switching unit G6 provides bias signal BIAS, output from bias signal BIAS output terminal 50, to first and second virtual ground controllers V_C1 and V_C2. Mode switching unit G6 may comprise a NOR gate NOR51, an inverter INV52, a first transmission gate GT51, and a second transmission gate GT52.

NOR gate NOR51 receives a burn in test enable signal BI and a standby leakage current test enable signal DFTIsb. Inverted standby leakage current test enable signal DFTIsbB denotes a signal that is an inverted version of standby leakage current test enable signal DFTIsb. In a normal mode, which is the usual operating mode of the semiconductor memory device, burn in test enable signal BI and standby leakage current test enable signal DFTIsb each have a logic low level. During a burn in test, burn in test enable signal BI has a logic high level, and during a standby leakage current test, standby leakage current test enable signal DFTIsb has a logic high level.

During a standby leakage current test, the output of NOR gate NOR51 has a logic low level, so transmission gate GT51 is turned OFF, and transmission gate GT52 is turned ON. When that occurs, the voltage level of bias signal BIAS is set approximately equal to power source voltage VCC. Thus, all NMOS transistors NM1 to NMn and NM11 to NMm shown in FIG. 4 are turned ON, and a difference between the voltage level of a ground voltage VSS and the level of each of the voltages apparent on first and second virtual ground terminals Vgnd1 and Vgnd2 is reduced. In particular, a voltage approximately equal to ground voltage VSS is provided to each of first and second virtual ground terminals Vgnd1 and Vgnd2, and the standby leakage current test is then performed. During the standby leakage current test, mode switching unit G6 maintains the voltage level apparent on each of first and second virtual ground terminals Vgnd1 and Vgnd2 at a first voltage and not at a voltage that varies.

If the difference between the voltage level of ground voltage VSS and the level of the voltage apparent on each of first and second virtual ground terminals Vgnd1 and Vgnd2 is relatively large, the result of a standby leakage current test performed on memory cells of the semiconductor memory device may be uncertain. The amount of error in a standby leakage current test performed on memory cells can be reduced by performing the standby leakage current test on memory cells with a lesser difference between the voltage level of ground voltage VSS and the voltages apparent on first and second virtual ground terminal Vgnd1 and Vgnd2. In accordance with an embodiment of the invention, the respective differences between the level of ground voltage VSS and the levels of the voltages apparent on each of first and second virtual ground terminals Vgnd1 and Vgnd2 may each be less than 10 mV.

In accordance with an embodiment of the invention, the burn in test, like the standby leakage current test, is performed wherein the levels of the voltages apparent on first and second virtual ground terminals Vgnd1 and Vgnd2 are approximately equal to ground voltage VSS, and not a variable voltage.

Figure 6A:
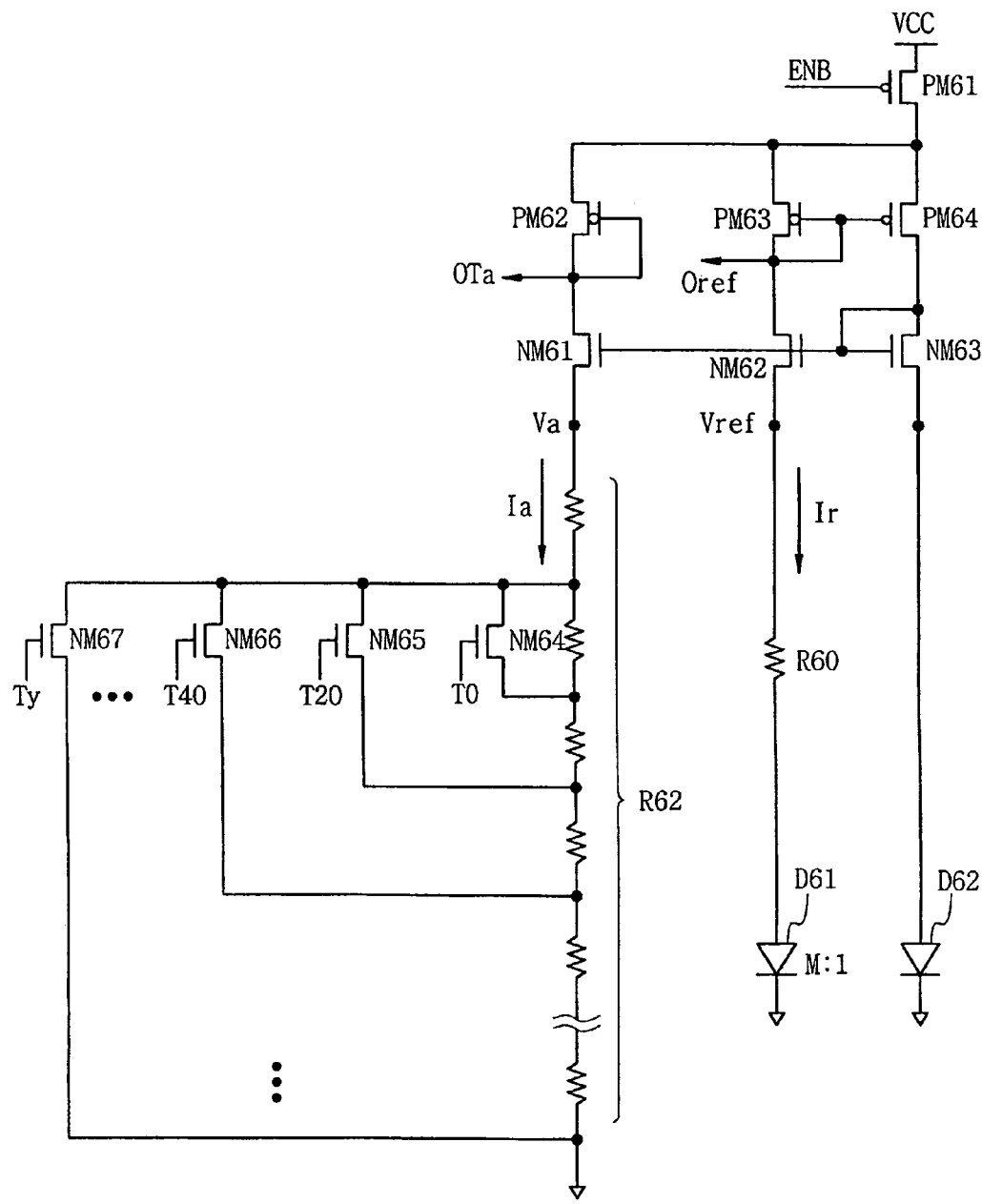
FIG. 6A is a circuit diagram illustrating a portion of the temperature information generating unit of FIG. 4 in accordance with an embodiment of the invention, wherein the temperature information generating unit is adapted to generate a temperature information signal.
Figure 6B:
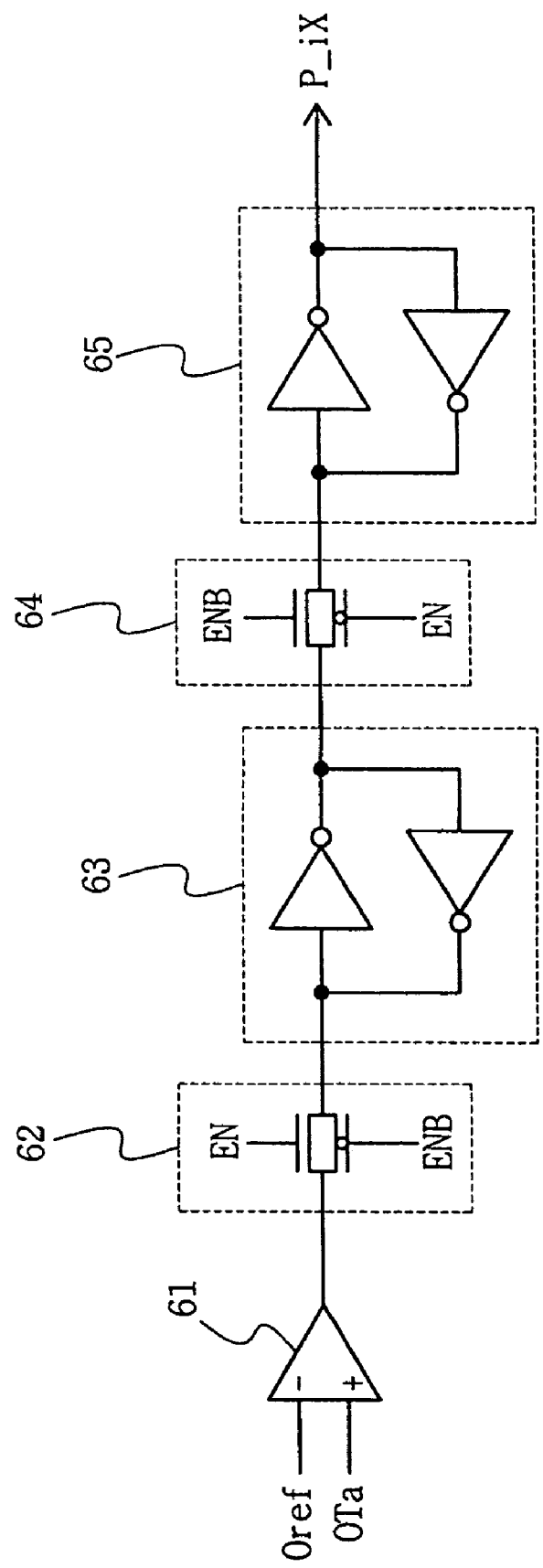
FIG. 6B is a circuit diagram illustrating another portion of the temperature information generating unit of FIG. 4 in accordance with an embodiment of the invention, wherein the temperature information generating unit is adapted to generate a temperature information signal.

FIGS. 6A and 6B are circuit diagrams illustrating portions of the temperature information generating unit 42 of FIG. 4, which is adapted to generate a temperature information signal. FIG. 6A illustrates a temperature sensor and FIG. 6B illustrates a sensor output signal controller.

Referring to FIG. 6A, a temperature sensor may comprise a PMOS transistor PM61 adapted to receive an enable signal ENB and transfer a power source voltage VCC, a PMOS transistor PM62 adapted to receive a sensing temperature voltage OTa through a gate terminal, and PMOS transistors PM63 and PM64 each adapted to receive a reference voltage Oref through their respective gate terminals. The temperature sensor of FIG. 6A may also comprise NMOS transistors NM61, NM62, and NM63 that each receive and are driven in response to a voltage apparent on a common drain terminal of PMOS transistor PM64 and NMOS transistor NM63 (i.e., the drain terminals of PMOS transistor PM64 and NMOS transistor NM63, which are electrically connected). The temperature sensor of FIG. 6A may also comprise NMOS transistors NM64, NM65, NM66, and NM67 adapted to receive clock coding signals T0, T20, T40, . . . , and Ty, respectively. The temperature sensor of FIG. 6A may comprise one or more additional NMOS transistors analogous to NMOS transistors NM64, NM65, NM66, and NM67 that are adapted to receive one or more additional clock coding signals analogous to clock coding signals T0, T20, T40, . . . , and Ty, respectively. The temperature sensor of FIG. 6A may also comprise a resistance unit R62, and diodes D61 and D62. A terminal of NMOS transistor NM62 may be connected to diode D61 and a terminal of NMOS transistor NM63 may be connected to diode D62.

PMOS transistor PM61 is adapted to receive enable signal ENB and transfer power source voltage VCC to PMOS transistors PM62, PM63, and PM64.

PMOS transistor PM62 is controlled in response to sensing temperature voltage OTa and transfers power source voltage VCC in only one direction. PMOS transistor PM62 is turned OFF when sensing temperature voltage OTa transitions from a logic low level to a logic high level.

The operation of PMOS transistors PM63 and PM64 is similar to the operation of PMOS transistor PM62. That is, PMOS transistors PM63 and PM64 are each controlled in response to reference voltage Oref, each transfer power source voltage VCC in only one direction, and are each turned OFF when reference voltage Oref transitions from a logic low level to a logic high level.

When the level of the voltage apparent on the common drain terminal of PMOS transistor PM64 and NMOS transistor NM63 transitions from a logic low level to a logic high level, each of NMOS transistors NM61, NM62, and NM63 is turned ON and transfers power source voltage VCC to another of its terminals (i.e., the terminal that is not the gate terminal and does not receive power source voltage VCC).

A voltage apparent between NMOS transistor NM61 and resistance unit R62 may be defined herein as voltage Va, and a current flowing in resistance unit R62 may be defined as current Ia.

The effective size of resistance unit R62 (i.e., the amount of resistance unit R62 used by the temperature sensor of FIG. 6A) can be controlled in accordance with clock coding signals T0, T20, T40, . . . , and Ty, wherein "y" is a positive integer. Thus, voltage Va apparent between NMOS transistor NM61 and resistance unit R62 varies in accordance with clock coding signals T0, T20, T40, . . . , and Ty.

An exemplary configuration of the temperature sensor of FIG. 6A will now be described with reference to FIG. 6A. When, for example, the temperature sensor of FIG. 6A divides a temperature range of −20 to 140° C. into eight sections, Ty becomes T140 (and the temperature sensor of FIG. 6A also uses clock coding signals T60, T80, T100, T120, which correspond to additional NMOS transistors that are not shown in FIG. 6A), and the variable "n" of FIG. 5B is 7 (i.e., temperature sensing sub-signal P_in (of FIG. 5B) is second temperature sensing sub-signal P_i7). In addition, clock coding signal T0 corresponds to the −20 to 0° C. portion of the temperature range. As used herein, a Temp0 to Temp1° C. portion of the temperature range means a portion of the temperature range corresponding to temperatures exceeding Temp0° C. but less than Temp1° C., wherein "Temp0" and "Temp1" are variables indicating temperature values. Additionally, clock coding signal T20 corresponds to a 0 to 20° C. portion of the temperature range, clock coding signal T40 corresponds to a 20 to 40° C. portion of the temperature range, clock coding signal T60 corresponds to a 40 to 60° C. portion of the temperature range, clock coding signal T80 corresponds to a 60 to 80° C. portion of the temperature range, clock coding signal T100 corresponds to a 80 to 100° C. portion of the temperature range, clock coding signal T120 corresponds to a 100 to 120° C. portion of the temperature range, and clock coding signal T140 corresponds to a 120 to 140° C. portion of the temperature range.

In accordance with the preceding example, when only clock coding signal T0 (which corresponds to the −20 to 0° C. portion of the temperature range) has a logic high level (i.e., when only clock coding signal T0 is applied), only NMOS transistor NM64 is turned ON while NMOS transistors NM65, NM66, and NM67 (and the NMOS transistors that respectively correspond to clock coding signals T60, T80, T100, T120 (which are not shown in FIG. 6A)) are turned OFF. Thus, a resistance of resistance unit R62 decreases (compared to when more of the previously-mentioned transistors are turned ON) and current Ia increases. Thus, sensing temperature voltage OTa varies in accordance with clock coding signals.

On the other hand, a current drive capability rate of diode D61 and diode D62 is M: 1. Current Ir flowing in diode D61 will be expressed by the following equation:

$$Ir=(kT/q)1\ nM/R$$

Referring to the preceding equation, current Ir flowing in diode D61 is proportional to a current drive capability rate M and an absolute temperature T, and is inversely proportional to a resistance R of resistor R60 and an amount of charge q. Reference voltage Oref is calculated in accordance with the value of current Ir.

Sensing temperature voltage OTa and reference voltage Oref are each provided to the sensor output signal controller illustrated in FIG. 6B.

Referring to FIG. 6B, the sensor output signal controller of FIG. 6B may comprise a comparator 61 adapted to compare a sensing temperature voltage OTa output from the temperature sensor of FIG. 6A with reference voltage Oref. The sensor output signal controller of FIG. 6B may also comprise a transmission gate 62 comprising an NMOS transistor controlled in accordance with an enable signal EN and a PMOS transistor controlled in accordance with an enable signal ENB. Enable signal EN and enable signal ENB have opposite logic levels (e.g., when one has a logic high level, the other has a logic low level). Transmission gate 62 may also be adapted to output a signal received from comparator 61. The sensor output signal controller of FIG. 6B may also comprise a latch unit 63 adapted to invert and latch a signal received from transmission gate 62. In addition, the sensor output signal controller of FIG. 6B may comprise a transmission gate 64 comprising an NMOS transistor controlled in accordance with enable signal ENB and a PMOS transistor controlled in accordance with enable signal EN. Transmission gate 64 may also be adapted to output an output signal received from latch unit 63. The sensor output signal controller of FIG. 6B may also comprise a latch unit 65 adapted to invert and latch a signal received from transmission gate 64.

In the sensor output signal controller of FIG. 6B, transmission gate 62 is turned ON and transmission gate 64 is turned OFF while the temperature sensor of FIG. 6A operates, which is when enable signal ENB has a logic low level (and therefore enable signal EN has a logic high level). Thus, latch unit 63 latches an inverted version of the signal output by comparator 61. Then, when enable signal ENB has a logic high level (and thus enable signal EN has a logic low level), transmission gate 62 is turned OFF and transmission gate 64 is turned ON. The signal latched by latch unit 63 is then inverted by latch unit 65 and provided to first bias voltage controller G2 (of FIG. 5B) as a temperature sensing sub-signal P_iX. When used as part of an index herein, "X" is an integer between 0 and "n" inclusive, wherein "n" is the same "n" used in FIG. 5B.

The temperature sensor of FIG. 6A is enabled in response to enable signal ENB, receives clock coding signals T0, T20, T40, . . . , and Ty and outputs sensing temperature voltage OTa and reference voltage Oref. The sensor output signal controller of FIG. 6B receives sensing temperature voltage OTa and reference voltage Oref, and outputs temperature sensing sub-signal P_iX.

FIGS. 6A and 6B illustrate a temperature sensor and a sensor output signal controller, respectively, of temperature information generator 42 of FIG. 4 in accordance with an exemplary embodiment of the invention. However, temperature information generator 42 of FIG. 4 may be implemented in various ways in accordance with embodiments of the invention.

Figure 7:
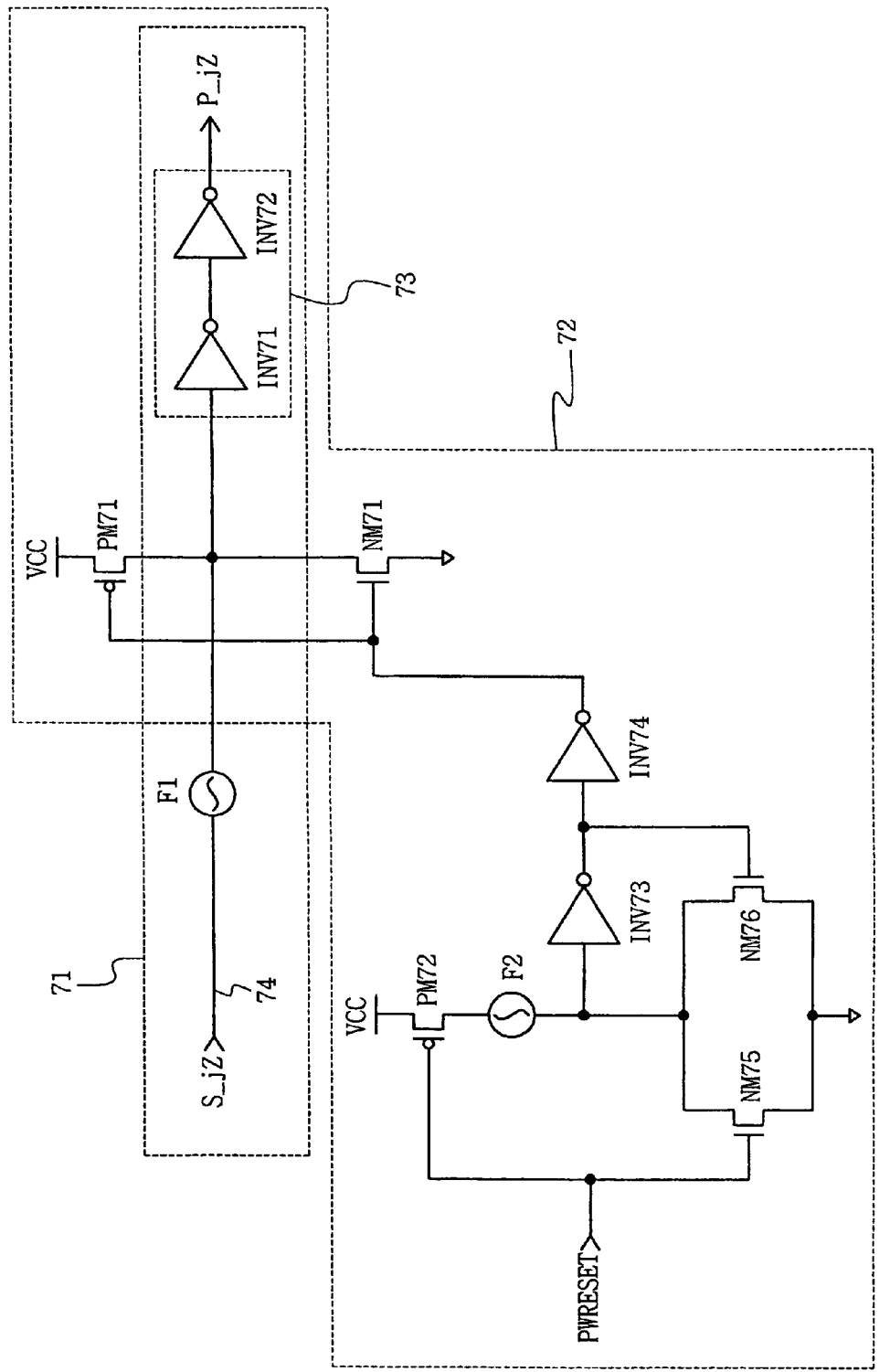
FIG. 7 is a circuit diagram illustrating a portion of the fuse cutting unit of FIG. 4 in accordance with an embodiment of the invention, wherein the illustrated portion of the fuse cutting unit is adapted to generate a fuse cutting sub-signal.

FIG. 7 is a circuit diagram of a portion of the fuse cutting unit of FIG. 4 in accordance with an embodiment of the invention. The portion of the fuse cutting unit illustrated in FIG. 7 is adapted to generate a fuse cutting sub-signal P_jZ of fuse cutting sub-signals P_j0 to P_jl of FIG. 5B (i.e., "Z" is an integer between 0 and "l" inclusive).

Referring to FIG. 7, the portion of the fuse cutting unit illustrated in FIG. 7 may comprise a wafer level test path 71 and a fuse cutting signal generating path 72.

Wafer level test path 71 may comprise a first fuse F1 and a buffer 73 comprising inverters INV71 and INV72. A test signal S_jZ is applied to wafer level test path 71 in a standby leakage current test performed at the wafer level. Test signal S_jZ may be applied to wafer level test path 71 through a pad associated with wafer level test path 71. In addition, test signal S_jZ is received by wafer level test path 71 through a test signal input terminal 74. Buffer 73 receives and buffers test signal S_jZ, which buffer 73 outputs as fuse cutting sub-signal P_jZ. Buffer 73 provides signal fuse cutting sub-signal P_jZ, which is test signal S_jZ buffered by buffer 73, to a second bias voltage controller G3 shown in FIG. 5B. First fuse F1 is disposed between the input terminal adapted to receive test signal S_jZ and buffer 73, and is cut off after the standby leakage current test (i.e., after the standby leakage current test, test signal S_jZ is disconnected from buffer 73 using first fuse f1).

Fuse cutting signal generating path 72 may comprise a PMOS transistor PM72 and an NMOS transistor NM75, which are each controlled in accordance with a power reset signal PWRESET; an inverter INV73 adapted to receive and invert a signal apparent on a common drain terminal of NMOS transistor NM75 and PMOS transistor PM72; and an inverter INV74 adapted to invert a signal output from inverter INV73. Fuse cutting signal generating path 72 may further comprise an NMOS transistor NM76. The gate terminal of NMOS transistor NM76 is connected to the output terminal of inverter INV73 (and thus is adapted to receive a signal output from inverter INV73), and NMOS transistor NM76 shares a drain terminal and a source terminal with NMOS transistor NM75 (i.e., the respective drain terminals of NMOS transistor NM75 and NMOS transistor NM76 are electrically connected forming a common drain terminal and the respective source terminals of NMOS transistor NM75 and NMOS transistor NM76 are electrically connected forming a common source terminal). Fuse cutting signal generating path 72 may also comprise a PMOS transistor PM71 and an NMOS transistor NM71, which are each controlled in accordance with an output signal of inverter INV74. The respective drain terminals of PMOS transistor PM71 and NMOS transistor NM71 are electrically connected forming a common drain terminal, and the common drain terminal of PMOS transistor PM71 and NMOS transistor NM71 is connected to an input terminal of buffer 73. In addition, power source voltage VCC is applied to source terminals of PMOS transistor PM72 and PMOS transistor PM71, the common source terminal of NMOS transistor NM75 and NMOS transistor NM76 is grounded, and a source terminal of NMOS transistor NM71 is also grounded. A second fuse F2 is electrically connected between a drain terminal of PMOS transistor PM72 and inverter INV73. PMOS transistor PM71 and NMOS transistor NM71 may have a size (e.g. small width and long length) in order to have less influence on test signal S_jZ.

Power reset signal PWRESET has a characteristic behavior of increasing to a given voltage level and then decreasing to a relatively low level, which is a voltage level lower than the output voltage of internal voltage regulator 41 (of FIG. 4).

Second fuse F2 is cut off (i.e., trimmed) depending upon the result of a standby leakage current test performed on memory cells.

In addition, power reset signal PWRESET is applied to fuse cutting signal generating path 72, and buffer 73 buffers a first signal output from the common drain terminal of PMOS transistor PM71 and NMOS transistor NM71, wherein the first signal is generated in response to power reset signal PWRESET. Buffer 73 then provides the first signal (which has been buffered) to second bias voltage controller G3 shown in FIG. 5B as fuse cutting sub-signal P_jZ.

The cutting of second fuse F2 in accordance with an embodiment of the invention will now be described.

When the result of a standby leakage current test performed on memory cells indicates that standby leakage current is greater than a reference value, the voltage level of bias signal BIAS should decrease. That is why, when the voltage level of bias signal BIAS, which is the voltage applied to gate terminals of NMOS transistors NM1 to NMn and NM11 to NMm (shown in FIG. 4), decreases while NMOS transistors NM1 to NMn and NM11 to NMm are in the active state, the voltage level of virtual ground terminal Vgnd shifts, and the standby leakage current leakage of memory cells may thereby be reduced. Alternatively, when the result of a standby leakage current test performed on memory cells indicates that standby leakage current is less than a reference value, the voltage level of bias signal BIAS can increase. That is why, when the voltage level of bias signal BIAS, which is the voltage applied to gate terminals of NMOS transistors NM1 to NMn and NM11 to NMm (shown in FIG. 4), increases while NMOS transistors NM1 to NMn and NM11 to NMm are in the active state, the voltage level apparent on virtual ground terminal Vgnd may be lowered, and the standby leakage current of memory cells can thereby be reduced to below a reference value. The active state referred to above may be a state in which the amount of current at the source terminal of a MOS transistor varies in accordance with variation in the amount of current at the gate terminal of the MOS transistor.

For example, when the result of a standby leakage current test performed on memory cells is greater than a reference value, second fuse F2 is cut off. Then, in accordance with power reset signal PWRESET, PMOS transistor PM71 is turned ON and fuse cutting sub-signal P_jZ is set to a logic high level.

Alternatively, when the result of a standby leakage current test performed on memory cells is lower than a reference value, second fuse F2 is not cut off. Thus, in accordance with power reset signal PWRESET, PMOS transistor PM72 is turned ON and NMOS transistor NM71 is turned ON, and fuse cutting sub-signal P_jZ is thereby set to a logic low level.

Fuse cutting sub-signals P_j0 to P_jl shown in FIG. 5B are each generated through the method described above using analogous portions of the fuse cutting unit, although they need not all be generated using the same portion of the fuse cutting unit (i.e., the portion illustrated in FIG. 7).

Figure 8:
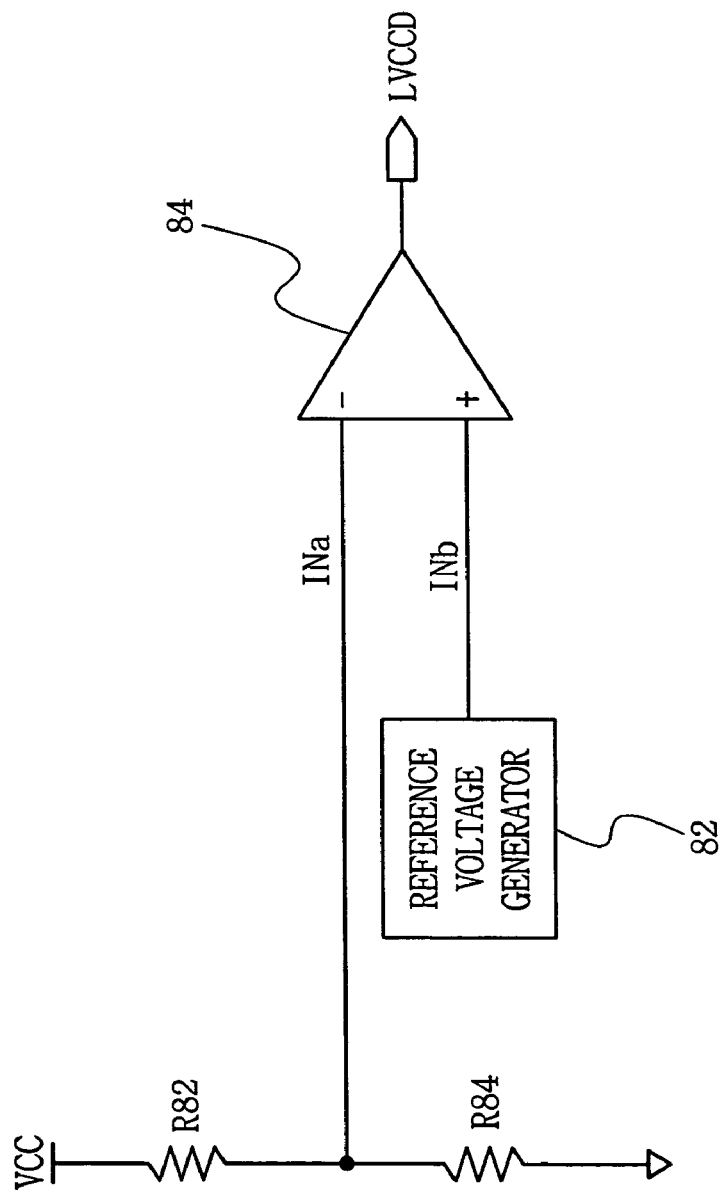
FIG. 8 is a circuit diagram illustrating a low power detector shown in FIG. 4 in accordance with an embodiment of the invention.

FIG. 8 is a circuit diagram illustrating low power (LVCC) detector 44 of FIG. 4 in accordance with an embodiment of the invention.

Referring to FIG. 8, an applied power source voltage VCC is divided by first and second resistors R82 and R84, and a divided voltage INa is applied to a negative input terminal of a comparator 84. A reference voltage INb generated by a reference voltage generator 82 is applied to a positive input terminal of comparator 84.

Comparator 84 compares divided voltage INa with reference voltage INb, and outputs an output signal LVCCD in accordance with the comparison result. When the voltage level of power source voltage VCC is relatively high (i.e., greater than the voltage level of a target voltage), the voltage level of divided voltage INa will also be relatively high (i.e., greater than reference voltage INb), and comparator 84 will compare divided voltage INa and reference voltage INb and output a signal having a logic low level. That is, output signal LVCCD having a logic low level will be output by comparator 84.

Alternatively, when the voltage level of power source voltage VCC is relatively low (i.e., lower than the voltage level of the target voltage), the voltage level of divided voltage INa will also be relatively low (i.e., lower than the voltage level of reference voltage INb), and comparator 84 will detect when divided voltage INa has dropped below reference voltage INb. The point in time at which divided voltage INa drops below reference voltage INb is called a low voltage detection point, and after divided voltage INa has dropped below reference voltage INb, comparator 84 will output a signal having a logic high level. That is, output signal LVCCD having a logic high level will be output by comparator 84. When output signal LVCCD having a logic high level is output by comparator 84, power source voltage VCC will become equal to the target voltage.

When power source voltage VCC has a voltage level that is below low power source voltage LVCC (i.e., the target voltage), output signal LVCCD having a logic high level is applied to inverter INV51 corresponding to low power margin F maintaining unit G4 shown in FIG. 5B, and output signal LVCCD is thereby inverted. Then, inverted output signal LVCCD is applied to low power margin maintaining unit G4, turning ON PMOS transistor PM53 of FIG. 5B. The operation of the semiconductor memory device illustrated in FIG. 4 after transistor PM53 of FIG. 5B has been turned ON has been described previously with reference to FIG. 4 and thus will not be described here.

Figure 9:
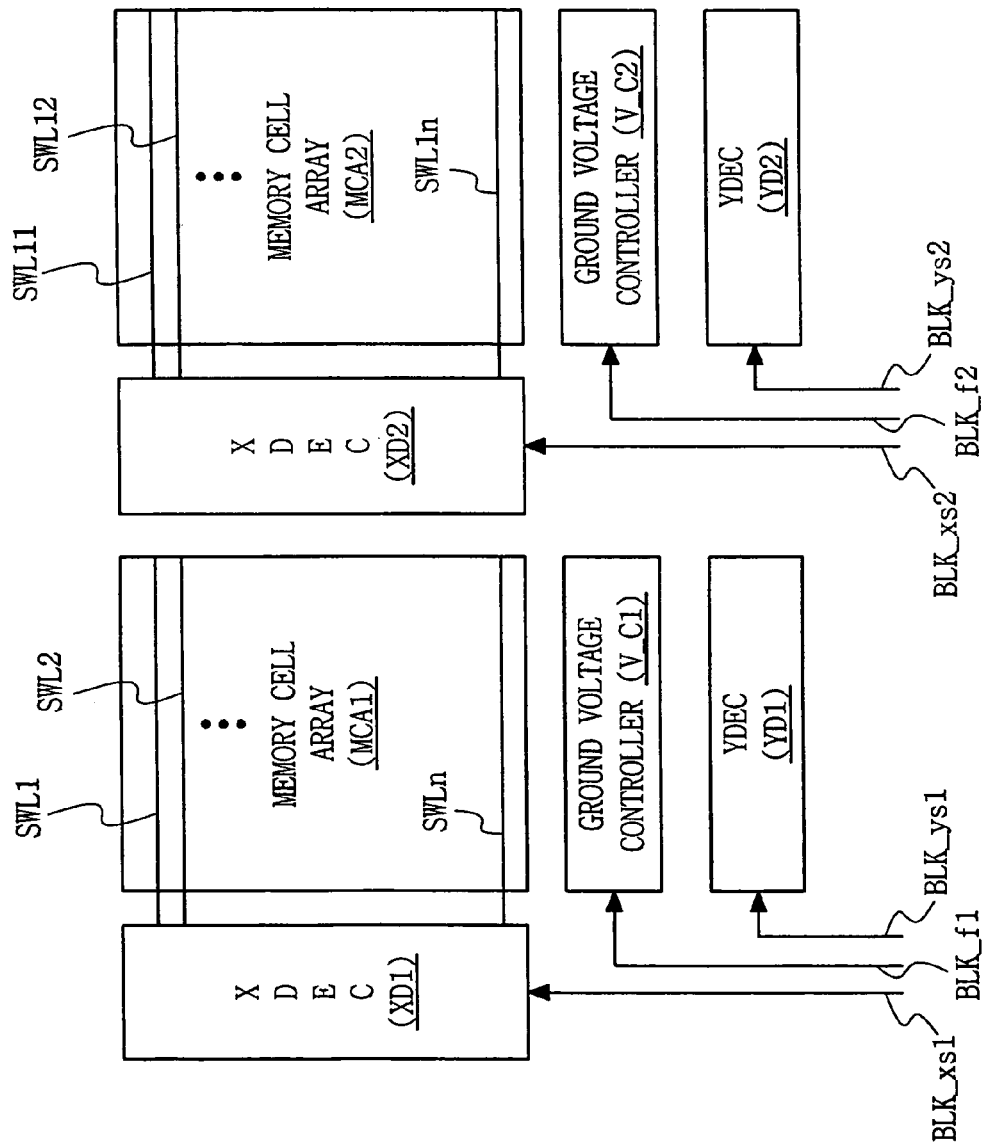
FIG. 9 is a block diagram of a portion of the semiconductor memory device of FIG. 4 in accordance with an embodiment of the invention that illustrates block control signals, and features not shown in FIG. 4 such as selection signals and sub word lines of the semiconductor memory device.
Figure 10:
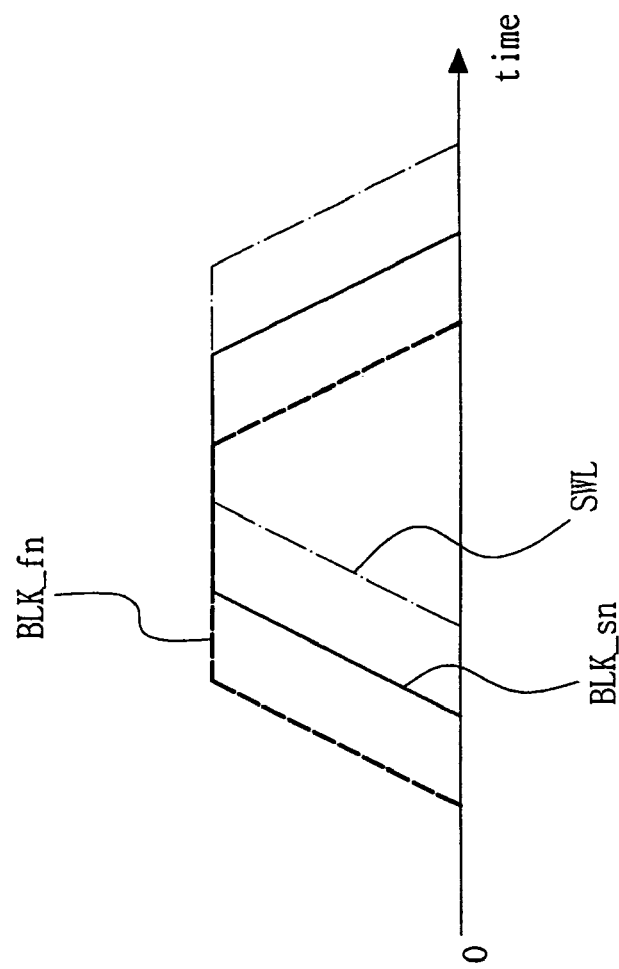
FIG. 10 is a timing diagram illustrating the timings with which block control signals, sub word lines, and selection signals of FIG. 9 transition between logic levels in accordance with an embodiment of the invention.

FIG. 9 is a block diagram illustrating a portion of the semiconductor memory device of FIG. 4 and showing block control signals BLK_f1 and BLK_f2 shown in FIG. 4; and showing features not shown in FIG. 4 such as sub word lines SWL1, SWL2, . . . , and SWLn; sub word lines SWL11, SWL12, . . . , and SWL1n; and selection signals BLK_xs1, BLK_xs2, BLK_ys1, BLK_ys2. FIG. 10 illustrates the timing of the block control signals and the selection signals of FIG. 9, and well as enabling/disabling timings for the sub word lines shown in FIG. 9. The variable "n" used in relation to FIGS. 9 and 10 is a positive integer, and is not necessarily the same "n" used in relation to FIGS. 4 and 5.

Referring to FIG. 9, first row decoder (XDEC) XD1 is adapted to enable sub word lines SWL1, SWL2, . . . , and SWLn, which are connected to memory cells in first memory cell array MCA1. Second row decoder (XDEC) XD2 is adapted to enable sub word lines SWL11, SWL12, . . . , and SWL1n, which are connected to memory cells in second memory cell array MCA2. First and second column decoders (YDECs) YD1 and YD2 are adapted to enable bit lines (not shown) that are connected to memory cells in first and second memory cell arrays MCA1 and MCA2, respectively. First virtual ground controller V_C1 controls the level of the voltage apparent on first virtual ground terminal Vgnd1 (of FIG. 4) of first memory cell array MCA1, and second virtual ground controller V_C2 controls the level of the voltage apparent on second virtual ground terminal Vgnd2 (of FIG. 4) of second memory cell array MCA2.

In FIGS. 9 and 10, reference symbol BLK_fn of FIG. 10 denotes either block control signal BLK_f1 or block control signal BLK_f2 of FIG. 9; reference symbol BLK_sn denotes a selection signal from among selection signals BLK_xs1, BLK_xs2, BLK_ys1, BLK_ys2 of FIG. 9 that corresponds to BLK_fn (i.e., if BLK_fn is BLK_f1, then BLK_sn is BLK_xs1 or BLK_ys1); and reference symbol SWL of FIG. 10 denotes a sub word line from among sub word lines SWL1, SWL2, . . . , and SWLn and SWL11, SWL12, . . . , and SWL1n of FIG. 9 that corresponds to BLK_fn (i.e., if BLK_fn is BLK_f1, then SWL is one of sub word lines SWL1, SWL2, . . . , and SWLn). Referring to FIGS. 9 and 10, a block control signal BLK_fn, which is applied to a corresponding one of first and second virtual ground controllers V_C1 and V_C2 to drive the level of the voltage apparent on a corresponding one of first and second virtual ground terminals Vgnd1 and Vgnd2 to ground voltage VSS during an active mode, is enabled (i.e., set to a logic high level) earlier than a selection signal BLK_sn received by a corresponding one of first and second row and column decoders XD1, XD2, YD1, and YD2 is enabled. In addition, a block control signal BLK_fn is enabled earlier than a sub word line SWL is enabled. Additionally, a block control signal BLK_fn is disabled (i.e., set to a logic low level) earlier than a selection signal BLK_sn received by a corresponding one of first and second row and column decoders XD1, XD2, YD1, and YD2 is disabled. In addition, block control signal BLK_fn is disabled earlier than a sub word line SWL is disabled.

Hence, in the active mode, virtual ground terminal Vgnd has a ground voltage VSS before any one of sub word lines SWL1, SWL2, . . . , and SWLn or SWL11, SWL12, . . . , and SWL1n is enabled, and thereby at least some of the reduction in the operating speed of the semiconductor memory device is prevented or the number of operating errors that occur in the semiconductor memory device is reduced.

When a semiconductor memory device comprising a standby leakage current reduction circuit in accordance with an embodiment of the invention is in the standby mode, sub word line SWL has a ground voltage VSS, and a source terminal of an access transistor of a memory cell has a voltage level substantially equal to the level of the voltage apparent on virtual ground terminal Vgnd (when the terminal of the access transistor that is connected to the bit line is regarded as the drain terminal). Thus, a negative voltage difference Vgs is formed, and leakage current escaping to the bit line in the standby mode is thereby reduced, wherein a voltage difference Vgs is a voltage difference between a gate terminal and a source terminal of the access transistor.

Figure 11:
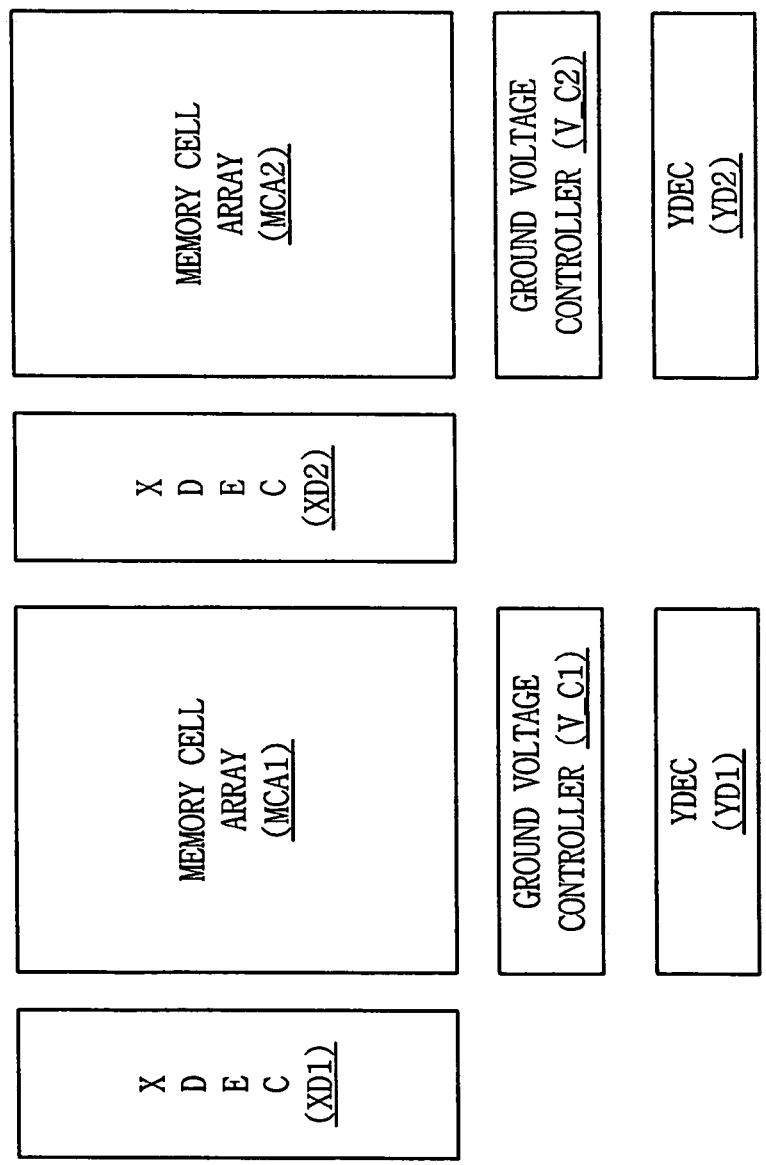
FIGS. 11 to 13 are block diagrams illustrating various placements of ground voltage controllers of FIG. 4 within a semiconductor memory device in accordance with respective embodiments of the invention.
Figure 12:
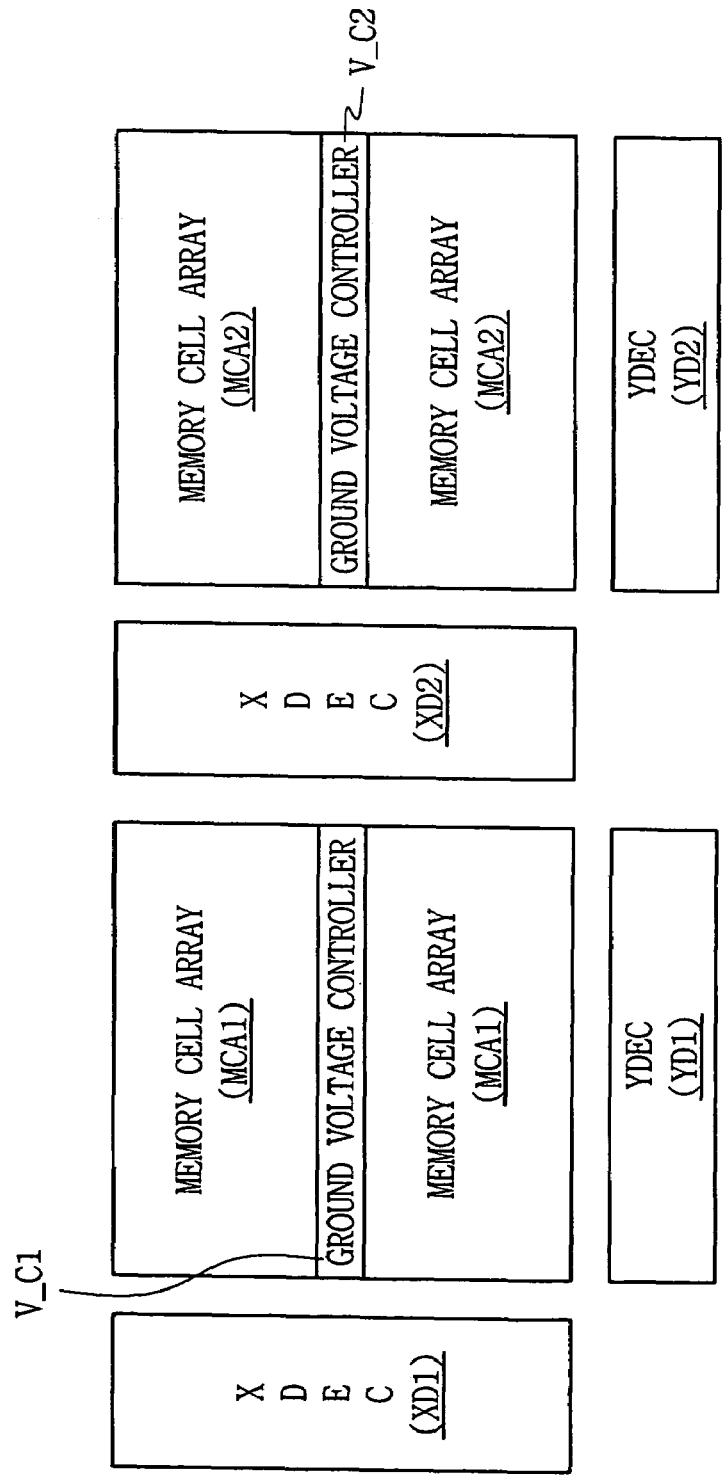
Figure 13:
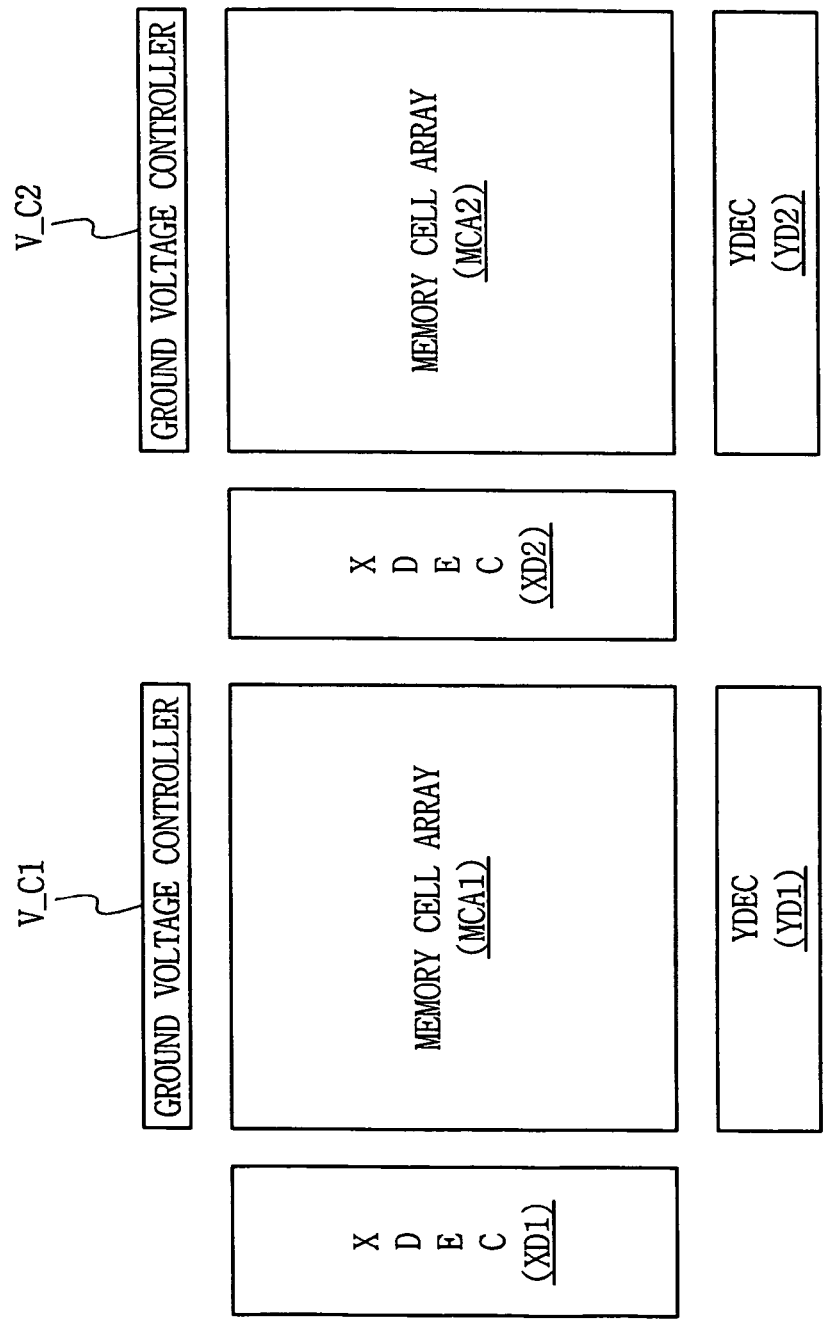

FIGS. 11 to 13 are block diagrams illustrating various placements of first and second virtual ground controllers V_C1 and V_C2 of FIG. 4 within a semiconductor memory device in accordance with respective embodiment of the invention. FIG. 11 illustrates a semiconductor memory device in accordance with an embodiment of the invention in which first and second virtual ground controllers V_C1 and V_C2 are respectively disposed between first and second memory cell arrays MCA1 and MCA2 and first and second column decoders YD1 and YD2. FIG. 12 illustrates a semiconductor memory device in accordance with an embodiment of the invention in which first virtual ground controller V_C1 is disposed within a region in which first memory cell array MCA1 is conventionally disposed. Also, in the embodiment illustrated in FIG. 12, second virtual ground controller V_C2 is disposed within a region in which second memory cell array MCA2 is conventionally disposed. FIG. 13 illustrates a semiconductor memory device in accordance with an embodiment of the invention in which first column decoder YD1 is disposed on a first side of first memory cell array MCA1 and first virtual ground controller V_C1 is disposed on a second side of first memory cell array MCA1 opposite the first side of first memory cell array MCA1. Also, in the embodiment illustrated in FIG. 13, second column decoder YD2 is disposed on a first side of second memory cell array MCA2 and second virtual ground controller V_C2 is disposed on a second side of second memory cell array MCA2 opposite the first side of second memory cell array MCA2.

Thus, in accordance with embodiments of the invention, first and second virtual ground controllers V_C1 and V_C2, which are adapted to control the level of the voltage apparent on first virtual ground terminal Vgnd1 and the level of the voltage apparent on second virtual ground terminal Vgnd2, respectively, may be disposed at various regions within a semiconductor memory device.

Figure 14:
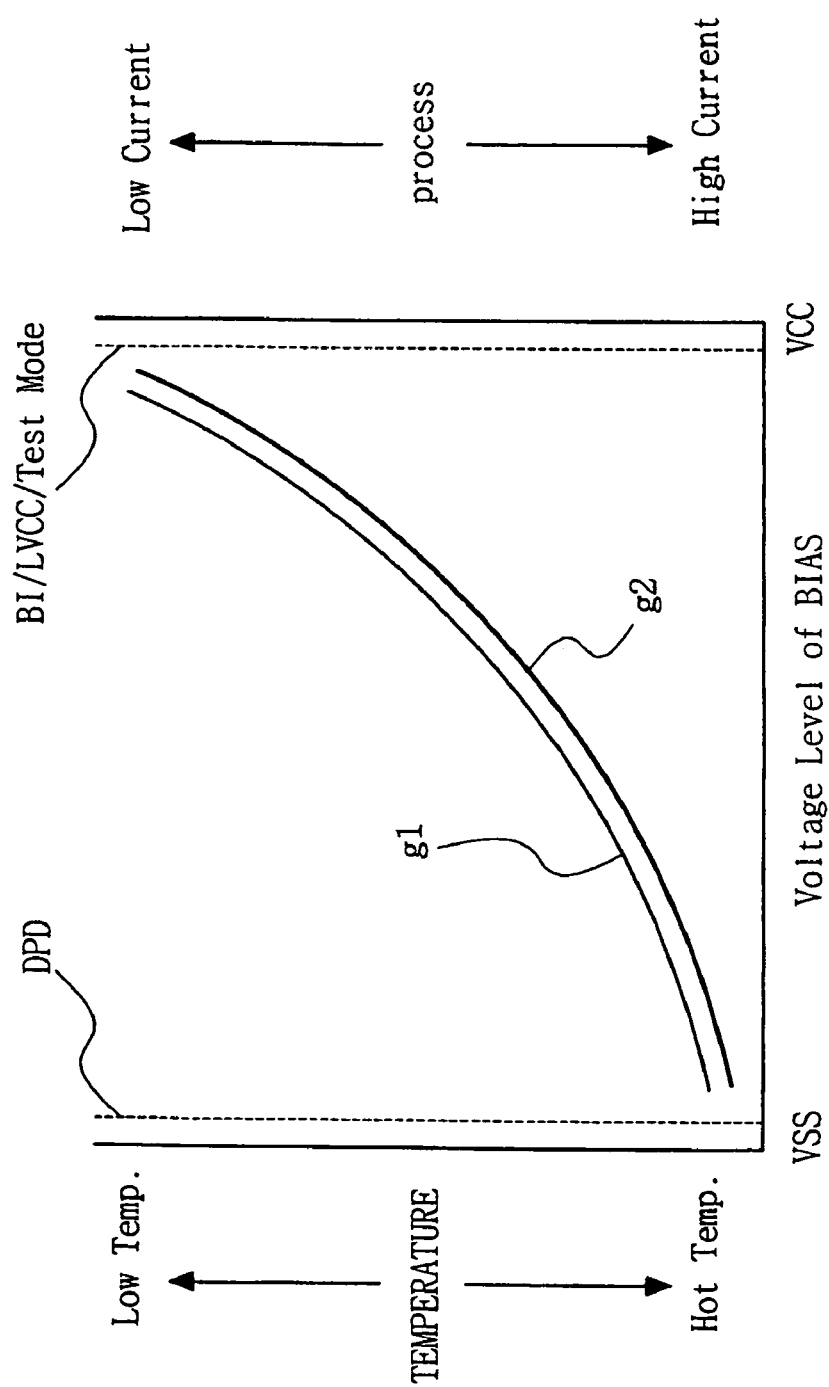
FIG. 14 is a graph illustrating the voltage level of a bias signal in accordance with the result of a standby leakage current test, and the voltage level of a bias signal in accordance with the temperature, each in a semiconductor memory device comprising a standby leakage current reduction circuit in accordance with an embodiment of the invention; and, FIG. 15 is a graph illustrating a distribution of the amount of standby leakage current per chip in both a conventional semiconductor memory device and a semiconductor memory device comprising a standby leakage current reduction circuit in accordance with an embodiment of the invention.

FIG. 14 is a graph illustrating the voltage level of bias signal BIAS in accordance with the result of a standby leakage current test, and the voltage level of bias signal BIAS in accordance with the temperature of the semiconductor memory device, each in a semiconductor memory device comprising a standby leakage current reduction circuit in accordance with an embodiment of the invention.

Referring to FIG. 14, curve g1 indicates the voltage level of bias signal BIAS in accordance with temperature, and curve g2 indicates the voltage level of bias signal BIAS in accordance with the result of a standby leakage current test (i.e., process scatter).

When the semiconductor memory device is in deep power down mode DPD, the voltage level of bias signal BIAS is approximately equal to ground voltage VSS. In deep power down mode DPD, bias signal BIAS has a uniform voltage level that is approximately equal to ground voltage VSS regardless of the result of a standby leakage current test or the temperature in the semiconductor memory device. The voltage level of bias signal BIAS is at its highest level during a burn-in test mode BI, while a low power source voltage LVCC is detected, and during a standby leakage current test mode (which is indicated in FIG. 14 as "Test Mode"). During each of those times, bias signal BIAS has a uniform voltage level approximately equal to power supply voltage VCC regardless of the process condition or the temperature of the semiconductor memory device.

Referring to curve g1 of FIG. 14, curve g1 illustrates that as temperature increases, the voltage level of bias signal BIAS decreases to a relatively low level, so the voltage level of virtual ground terminal Vgnd increases to a relatively high level, and thus standby leakage current is reduced. In addition, as temperature decreases, the voltage level of bias signal BIAS increases. When the temperature decreases, the standby leakage current decreases. Thus, when temperature decreases, the level of the voltage apparent on virtual ground terminal Vgnd decreases, so the level of standby leakage current may be reduced even though the voltage level of bias signal BIAS increases.

Referring to curve g2 of FIG. 14, when the result of a standby leakage current test performed on memory cells indicates a relatively high standby leakage current, the voltage level of bias signal BIAS decreases. Thus, the level of the voltage apparent on virtual ground terminal Vgnd increases, so standby leakage current is reduced. When standby leakage current is relatively low, the level of bias signal BIAS decreases. When standby leakage current has a low level, the bias voltage may decrease but remain within a range at which the standby leakage current remains lower than a reference value for the standby leakage current. Thus, even if voltage level of bias voltage BIAS decreases, if it remains with the previously-mentioned range, the standby leakage current may still remain lower than the reference value.

As described above, the semiconductor memory device having a standby leakage current reduction circuit may control the level of the voltage apparent on virtual ground terminal Vgnd, thus reducing a standby leakage current.

Figure 15:
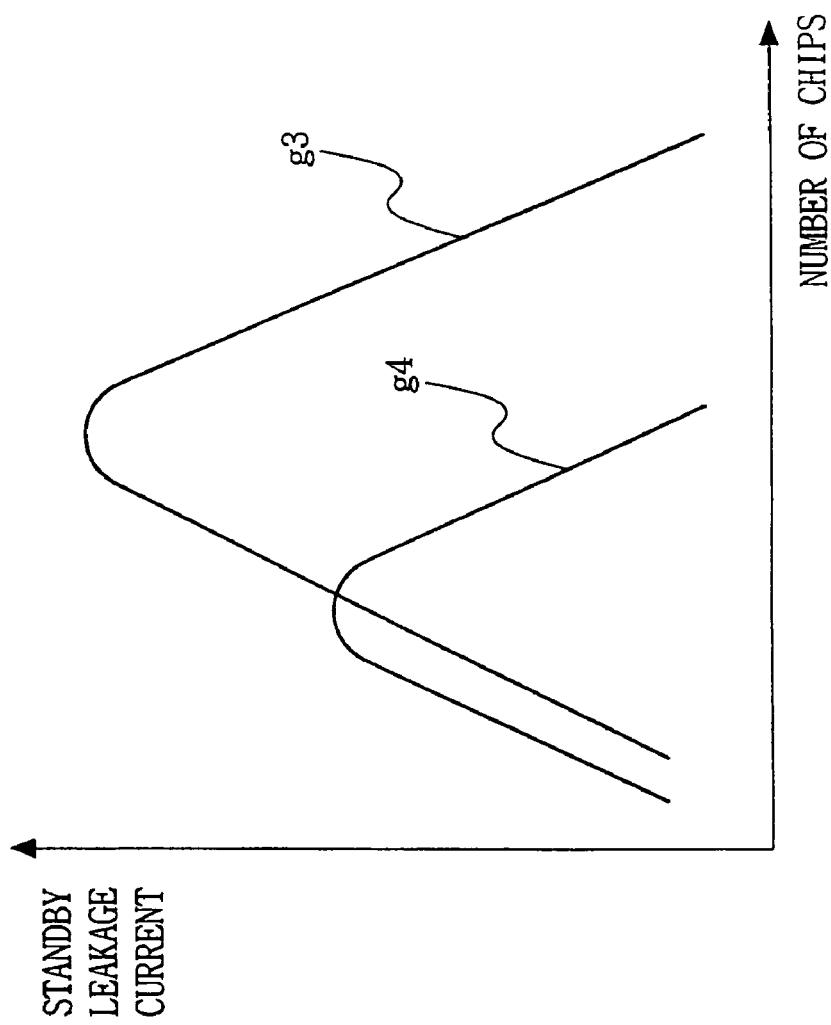

FIG. 15 is a graph illustrating a distribution of the amount of standby leakage current per chip in both a conventional semiconductor memory device and a semiconductor memory device having a standby leakage current reduction circuit in accordance with an embodiment of the invention.

Referring to the graph of FIG. 15, curve g3 illustrates a distribution of standby leakage current when the level of the voltage apparent on virtual ground terminal Vgnd is not controlled, and curve g4 indicates a graph of standby leakage current when the level of the voltage apparent on virtual ground terminal Vgnd is controlled using a standby leakage current reduction circuit in accordance with an embodiment of the invention.

As shown in FIG. 15, in accordance with an embodiment of the invention, controlling the level of the voltage apparent on virtual ground terminal Vgnd using a standby leakage current reduction circuit may substantially reduce standby leakage current compared to when the level of the voltage apparent on virtual ground terminal Vgnd is not controlled.

As described above, in accordance with embodiments of the invention, a semiconductor memory device comprising a standby leakage current reduction circuit may substantially reduce standby leakage current by controlling the level of a voltage apparent on virtual ground terminal Vgnd during a standby mode. In particular, standby leakage current may be substantially reduced by controlling the level of the voltage apparent on virtual ground terminal Vgnd in accordance with at least one of temperature and process information.

In accordance with embodiments of the invention, standby leakage current can be reduced using an improved standby leakage current reduction circuit and can be reduced in a semiconductor memory device comprising the improved standby leakage current reduction circuit.

In addition, in accordance with embodiments of the invention, an improved standby leakage current reduction circuit and a semiconductor memory device comprising the improved standby leakage current reduction circuit can reduce standby leakage current that may be caused by at least one of process scatter, temperature variation, and variation in the level of a voltage received from an external power source.

An improved standby leakage current reduction circuit and a semiconductor memory device comprising the same can reduce excess power consumption caused by standby leakage current.

Although embodiments of the invention have been described herein, modifications may be made to the embodiments by those skilled in the art without departing from the scope of the invention as defined by the accompanying claims.

What is claimed is:

1. A circuit adapted to reduce standby leakage current in a semiconductor memory device comprising memory cells, the circuit comprising:
   a bias signal generator adapted to generate a bias signal, wherein the bias signal generator sets a voltage level of the bias signal in accordance with a result of a standby leakage current test; and,
   a ground voltage controller connected between a ground terminal and a virtual ground terminal of at least one of the memory cells, adapted to receive the bias signal from the bias signal generator, and adapted to control a level of a voltage apparent on the virtual ground terminal in response to the bias signal while the semiconductor memory device is in a standby mode.

2. The circuit of claim 1, wherein the standby leakage current test measures standby leakage current during the standby mode.

3. The circuit of claim 1, wherein the ground voltage controller comprises at least one NMOS transistor adapted to operate in response to the bias signal.

4. The circuit of claim 3, further comprising a low power detector adapted to detect when a power source voltage is below a target voltage,
   wherein:
   the low power detector is adapted to divide the power source voltage to generate a divided voltage;
   the bias signal generator is adapted to receive an output signal from the low power detector and turn on the at least one NMOS transistor when the divided voltage is below a reference voltage.

5. The circuit of claim 1, wherein the bias signal generator is adapted to:
   receive a deep power down signal during a deep power down mode; and,
   set the bias signal to a first voltage level in response to the deep power down signal, wherein the ground voltage controller is adapted to allow the virtual ground terminal to float in response to the bias signal having the first voltage level.

6. The circuit of claim 1, wherein the ground voltage controller comprises a block controller adapted to receive a block control signal during an active mode and provide a ground voltage to the virtual ground terminal in response to the block control signal.

7. The circuit of claim 6, wherein:
   the block controller comprises an NMOS transistor; and,
   the block control signal is applied to a gate terminal of the NMOS transistor.

8. A circuit adapted to reduce a standby leakage current in a semiconductor memory device comprising memory cells, the circuit comprising:
   a temperature information generator;
   a bias signal generator electrically connected to the temperature information generator and adapted to generate a bias signal, wherein a voltage level of the bias signal is set in accordance with a temperature sensing signal output by the temperature information generator; and,
   a ground voltage controller connected between a ground terminal and a virtual ground terminal of at least one of the memory cells, adapted to receive the bias signal from the bias signal generator, and adapted to control a level of a voltage apparent on the virtual ground terminal in response to the bias signal while the semiconductor memory device is in a standby mode.

9. The circuit of claim 8, wherein the bias signal generator comprises a bias voltage controller adapted to influence the voltage level of the bias signal in response to the temperature sensing signal.

10. The circuit of claim 8, wherein the ground voltage controller comprises at least one NMOS transistor adapted to operate in response to the bias signal.

11. The circuit of claim 10, further comprising a low power detector adapted to detect when a power source voltage is below a target voltage,
wherein:
the low power detector is adapted to divide the power source voltage to generate a divided voltage; and,
the bias signal generator is adapted to receive an output signal from the low power detector and turn on the at least one NMOS transistor when the divided voltage is below a reference voltage.

12. The circuit of claim 8, wherein the bias signal generator is adapted to:
receive a deep power down signal during a deep power down mode; and,
set the bias signal to a first voltage level in response to the deep power down signal, wherein the ground voltage controller is adapted to allow the virtual ground terminal to float in response to the bias signal having the first voltage level.

13. A semiconductor memory device comprising:
a plurality of memory cells;
a temperature information generator;
a bias signal generator adapted to generate a bias signal and adapted to set a voltage level of the bias signal in accordance with a temperature sensing signal received from the temperature information generator and a result of a standby leakage current test; and,
a ground voltage controller connected between a ground terminal and a virtual ground terminal of at least one of the memory cells, adapted to receive the bias signal from the bias signal generator, and adapted to control a level of a voltage apparent on the virtual ground terminal in response to the bias signal while the semiconductor memory device is in a standby mode.

14. The device of claim 13, wherein the bias signal generator comprises a default voltage setting unit comprising:
first, second, and third nodes, wherein the second node is selectively electrically connected to a bias signal output terminal of the bias signal generator during an active mode;
a first PMOS transistor electrically connected to the first node and adapted to provide a power source voltage to the first node during the active mode, wherein the first PMOS transistor is turned off during a deep power down mode;
a second PMOS transistor electrically connected to the first and second nodes;
a first NMOS transistor electrically connected to the second and third nodes, wherein the second PMOS transistor and the first NMOS transistor are adapted to provide a default voltage to the second node; and,
a second NMOS transistor electrically connected to the third node and adapted to provide a ground voltage to the third node during the active mode, wherein the second NMOS transistor is turned off during the deep power down mode.

15. The device of claim 14, wherein the bias signal generator comprises a bias voltage controller adapted to receive the temperature sensing signal and influence the voltage level of the bias signal.

16. The device of claim 15, wherein the bias voltage controller comprises:
a first voltage control switch comprising at least one first voltage control sub-switch and adapted to receive a first temperature sensing signal comprising at least one first temperature sensing sub-signal, wherein the at least one first voltage control sub-switch is adapted to influence the voltage level of the bias signal in either one of a positive or a negative direction in response to the at least one first temperature sensing sub-signal; and,
a second voltage control switch comprising at least one second voltage control sub-switch and adapted to receive a second temperature sensing signal comprising at least one second temperature sensing sub-signal, wherein the at least one second voltage control sub-switch is adapted to influence the voltage revel of the bias signal in the positive direction in response to the at least one second temperature sensing sub-signal,
wherein the temperature sensing signal comprises the first and second temperature sensing signals.

17. The device of claim 16, wherein the at least one first voltage control sub-switch comprises:
a PMOS transistor adapted to influence the voltage level of the bias signal in the positive direction when the at least one first temperature sensing sub-signal has a logic low level; and,
an NMOS transistor adapted to influence the voltage level of the bias signal in the negative direction when the at least one first temperature sensing sub-signal has a logic high level.

18. The device of claim 16, wherein the at least one second voltage control sub-switch comprises a PMOS transistor adapted to influence the voltage level of the bias signal in the positive direction when the at least one second temperature sensing sub-signal has a logic low level.

19. The device of claim 13, wherein the bias signal generator comprises a bias voltage controller adapted to receive a fuse cutting signal corresponding to the result of the standby leakage current test and adapted to influence the voltage level of the bias signal.

20. The device of claim 19, wherein the semiconductor memory device further comprises a fuse cutting unit adapted to generate the fuse cutting signal indicating whether, in accordance with the result of the standby leakage current test, the standby leakage current is greater than or less than a reference value, wherein, in accordance with the fuse cutting signal, the bias signal generator is adapted to influence the voltage level of the bias signal in a negative direction when the standby leakage current is greater than the reference value and is adapted to influence the voltage level of the bias signal in a positive direction when the standby leakage current is less than the reference value.

21. The device of claim 20, wherein the fuse cutting unit comprises:
a wafer level test path comprising:
a buffer;
a test signal input terminal; and,
a first fuse electrically disposed between the test signal input terminal and the buffer,
wherein:
the buffer is adapted to buffer a test signal provided to the test signal input terminal during the standby leakage current test and output a fuse cutting sub-signal as a portion of the fuse cutting signal;

the wafer level test path is adapted to provide the fuse cutting sub-signal to the bias voltage controller; and, the first fuse is cut off after the standby leakage current test has been performed on the at least one of the memory cells; and, a fuse cutting signal generating path comprising:
a second fuse; and,
the buffer,
wherein:
the second fuse is cut off in accordance with the result of the standby leakage current test performed on the at least one of the memory cells;

the fuse cutting signal generating path is adapted to buffer a first signal generated in response to a power reset signal provided to the fuse cutting signal generating path; and, the fuse cutting signal generating path is adapted to provide the first signal to the bias voltage controller.

22. The device of claim 20, wherein the bias voltage controller comprises:

a third voltage control switch comprising at least one third voltage control sub-switch and adapted to receive a first fuse cutting signal comprising at least one first fuse cutting sub-signal, wherein the at least one third voltage control sub-switch is adapted to influence the voltage level of the bias signal in either one of the positive or the negative direction in response to the at least one first fuse cutting sub-signal; and, a fourth voltage control switch comprising at least one fourth voltage control sub-switch and adapted to receive a second fuse cutting signal comprising at least one second fuse cutting sub-signal, wherein the at least one fourth voltage control sub-switch is adapted to influence the voltage level of the bias signal in the positive direction in response to the at least one second fuse cutting sub-signal, wherein the fuse cutting signal comprises the first and second fuse cutting signals.

23. The device of claim 22, wherein the at least one third voltage control sub-switch comprises:

a PMOS transistor adapted to influence the voltage level of the bias signal in the positive direction in response to the at least one first fuse cutting sub-signal; and, an NMOS transistor adapted to influence the voltage level of the bias signal in the negative direction in response to the at least one first fuse cutting sub-signal.

24. The device of claim 22, wherein the at least one fourth voltage control sub-switch comprises a PMOS transistor adapted to operate in response to the at least one second fuse cutting sub-signal.

25. The device of claim 13, wherein:

the semiconductor memory device further comprises a low power detector adapted to detect when a power source voltage is below a target voltage and provide an output signal to the bias signal generator indicating whether the power source voltage is below the target voltage;

the ground voltage controller comprises at least one first transistor; and, the bias signal generator comprises a low power margin maintaining unit adapted to receive an inverted version of the output signal and increase the voltage level of the bias signal to a level sufficient to turn on the at least one first transistor when the output signal indicates that the power supply voltage is below the target voltage.

26. The device of claim 13, wherein:

the ground voltage controller comprises at least one first transistor; and, the bias signal generator further comprises a virtual ground terminal floating enable transistor adapted to turn off the at least one first transistor during a deep power down mode.

27. The device of claim 13, wherein the bias signal generator further comprises a mode switching unit adapted to:

provide the bias signal to the ground voltage controller during the standby mode; and, provide a power source voltage to the ground voltage controller during a test mode, wherein the ground voltage controller is adapted to provide a first voltage approximately equal to a ground voltage to the virtual ground terminal in response to the power source voltage.

28. The device of claim 13, wherein the ground voltage controller comprises a block controller adapted to receive a block control signal during an active mode and adapted to provide a first voltage approximately equal to a ground voltage to the virtual ground terminal in response to the block control signal.

* * * * *